United States Patent
Crozier et al.

(10) Patent No.: US 6,530,059 B1
(45) Date of Patent: Mar. 4, 2003

(54) TAIL-BITING TURBO-CODE ENCODER AND ASSOCIATED DECODER

(75) Inventors: Stewart N. Crozier, Groton, MA (US); Andrew Hunt, Ottawa (CA); John Lodge, Kanats (CA); Paul Guinand, Fitzroy Harbour (CA)

(73) Assignee: Her Majesty the Queen in right of Canada, as represented by the Minister of Industry Through the Communication Research Centre (CA)

( * ) Notice: Subject to any disclaimer, the term of this patent is extended or adjusted under 35 U.S.C. 154(b) by 0 days.

(21) Appl. No.: 09/324,812

(22) Filed: Jun. 1, 1999

Related U.S. Application Data

(60) Provisional application No. 60/087,591, filed on Jun. 1, 1998.

(51) Int. Cl.$^7$ .............................................. H03M 13/03
(52) U.S. Cl. ...................................................... 714/786
(58) Field of Search ......................................... 714/786

(56) References Cited

U.S. PATENT DOCUMENTS

| | | | | |
|---|---|---|---|---|
| 5,056,105 | A | 10/1991 | Darmon et al. | |
| 5,349,589 | A | 9/1994 | Chennakeshu et al. | |
| 5,369,671 | A | 11/1994 | Yehushua et al. | |
| 5,446,747 | A | 8/1995 | Berrou | |
| 5,719,875 | A | 2/1998 | Wei | |
| 5,734,962 | A * | 3/1998 | Hladik et al. ............... | 455/12.1 |
| 5,742,621 | A | 4/1998 | Amon et al. | |
| 5,764,649 | A | 6/1998 | Tong | |
| 6,014,411 | A * | 1/2000 | Wang ........................... | 375/259 |
| 6,023,783 | A * | 2/2000 | Divsalar et al. ............ | 714/792 |
| 6,044,116 | A * | 3/2000 | Wang ........................... | 375/265 |
| 6,192,501 | B1 * | 2/2001 | Hladik et al. ............... | 714/786 |
| 6,233,711 | B1 * | 5/2001 | Murayama et al. ......... | 714/786 |
| 6,266,795 | B1 * | 7/2001 | Wei et al. ................... | 714/755 |
| 6,275,538 | B1 * | 8/2001 | Ramesh et al. ............. | 375/265 |
| 6,289,486 | B1 * | 9/2001 | Lee et al. ................... | 714/788 |

OTHER PUBLICATIONS

Perez, L.C. and Costello, D.J.Jr.;Cascaded convolutional codes; Proceedings 1995 IEEE International Symposium on Information Theory, p. 160.*

Battail, G.; A conceptual framework for understanding turbo codes; IEEE Journal on Selected Areas in Communications, vol.: 16 Issue: 2, Feb. 1998 pp. 245–254.*

Weiss, C.; Bettstetter, C.; Riedel, S. and Costello, D.J., Jr; Turbo decoding with tail–biting trellises; International Symposium on Signals, Systems, and Electronics, 1998 pp. 343–348.*

Lang Lin and Cheng, R.S.; Improvements in SOVIA–based decoding for turbo codes; 1997 IEEE International Conference on Communications, Towards the Knowledge Millennium, vol.: 3, pp. 1473–1478 vol. 3.*

(List continued on next page.)

Primary Examiner—Albert Decady
Assistant Examiner—Joseph D. Torres
(74) Attorney, Agent, or Firm—Polster, Lieder Woodruff & Lucchesi L.C.

(57) ABSTRACT

A method of creating tail-biting recursive systematic convolutional and turbo codes, and the associated encoders, are described herein. According to the method, symbols from the set of data to be transmitted are used to preset the starting state of the encoder, and are replaced in a systematic set by an equivalent number of tail-biting symbols that force the ending state of the encoder to be the same as the starting state. The presetting of the starting state allows for simpler calculations in choosing the tail-biting symbols, and allows a message to be transmitted with a reduced number of symbols The reduction in the number of symbols used for overhead in this invention provides an increase in the data transmission rate.

33 Claims, 8 Drawing Sheets

OTHER PUBLICATIONS

Reed, M.C. and Pietrobon, S.S.; Turbo–code termination schemes and a novel alternative for short frames; Seventh IEEE International Symposium on Personal, Indoor and Mobile Radio Communications, 1996; vol.: 2, 1996 pp. 354–358 vol. 2.*

Blackert, W.J.; Hall, E.K. and Wilson, S.G.; Turbo code termination and interleaver conditions; Electronics Letters, vol.: 31 Issue: 24, Nov. 23, 1995 pp. 2082–2084.*

Barbulescu, A.S. and Pietrobon, S.S.; Terminating the trellis of turbo–codes in the same state; Electronics Letters, vol: 31 Issue: 1, Jan. 5, 1995 pp. 22–23.*

D. Divsalar and F. Pollara; On the Design of Turbo Codes; NASA Code 315–91–20–20–53.*

C. Berrou, A. Glavieux, and P. Thitimajshima; "Near Shannon Limit Error–Correcting Coding and Decoding Turbo–Codes"; The Proceedings of ICC 1993. Geneva, Switzerland, May 1993; pp 1064–1070.

C. Berrou, and A. Glavieux; "Near Optimum Error Correcting Coding and Decoding: Turbo Codes"; IEEE Trans. On Comm., vol. 44, No. 10, Oct. 1996.

B. Talibart and C. Berrou, "Notice Preliminaire du Circuit Turbo–Codeur/Decodeur TURBO4", Version 0.0, Jun., 1995.

P. Robertson, "Illuminating the Structure Code and Decoder of Parallel Concatenated Recursivr Systematic (Turbo) Codes", IEEE Globecom, pp. 1298–1303, Nov.–Dec. 1994.

G. Solomon and H. Tilborg, "A Connection Between Block and Convolutional Codes", SIAM J. Appl. Math, vol. 37, No. 2, pp. 358–369, Oct., 1979.

H. Ma and J. Wolf, "On Tail Biting Convolutional Codes", IEEETrans. On Comm., vol. COM–34, No. 2, pp. 104–111, Feb. 1986.

P. Guinand and J. Lodge, "Trellis Termination for Turbo Encoders", Proc. $17^{th}$ Biennial Symp. On Communications, Queen's University, Kingston, Canada pp. 389–392, May 30–Jun. 1, 1994.

C. Berrou and M. Jezequel, "Frame–Oreiented Convolutional Turbo–Codes", Elec. Letters, vol. 32, No. 15, pp. 1362–1364, Jul. 1996.

J. Anderson and S. Hladik, "Tailbiting MAP Decoders", IEEE Journal on Selected Areas in Communications, vol. 16, No. 2, pp. 297–302, Feb. 1998.

Y–P Wang , R. Ramesh, A. Hasson and H. Koorapaty, "On MAP Decoding for Tail–Biting Convolutional Codes", ISIT, Ulm, Germany, p. 225, Jun. 29–Jul. 4, 1997.

H–A Loeliger, "New Turbo–Like Codes", ISIT, Ulm, Germany, p. 109, Jun. 29–Jul. 4, 1997.

* cited by examiner

TAIL-BITING TURBO-CODE ENCODER AND ASSOCIATED DECODER

CROSS-REFERENCE TO RELATED APPLICATIONS

This application claims priority to provisional application Ser. No. 60/087,591 filed Jun. 1, 1998, entitled "Tail-Biting Turbo-Code Encoder and Associated Decoder", and which is incorporated herein by reference.

FIELD OF THE INVENTION

This invention relates to the field of digital communications, and is particularly concerned with improving error rate performance and increasing the transmission rate of convolutionally encoded data transmissions.

BACKGROUND OF THE INVENTION

Turbo-codes have received considerable attention in recent years due to their powerful error correcting capability, reasonable complexity, and flexibility in terms of providing different block sizes and code rates. The original paper on "Turbo-codes" was published by C. Berrou, A. Glavieux, and P. Thitamajshima and was entitled "Near Shannon Limit Error-Correcting Coding and Decoding: Turbo-Codes", Proceedings of ICC'93, Geneva, Switzerland, pp. 1064–1070, May, 1993. (Also, see C. Berrou, and A. Glavieux, "Near Optimum Error Correcting Coding and Decoding: Turbo-Codes", IEEE Trans. On Comm., Vol. 44, No. 10, October 1996 and B. Talibart and C. Berrou, "Notice Preliminaire du Circuit Turbo-Codeur/Decodeur TURBO4", Version 0.0, June 1995, and also U.S. Pat. No. 5,446,747.) A rate ½ binary code was represented that provides performance within 0.5 dB of the antipodal signaling capacity limit at a BER of $10^{-5}$. The canonical Turbo encoder consisted of two rate ½ recursive systematic convolutional (RSC) encoders operating in parallel with the data bits interleaved between the two encoders. Soft-in soft-out iterative processing based on a posteriori probability (APP) decoding principles was used. This is also referred to as maximum a posteriori (MAP) decoding in the literature. The interleaver block size used was 65,536. It is practical to look at much shorter block sizes, on the order of a few hundred bits, where the overhead associated with flush bits becomes important.

A problem that was recognized early in the design of Turbo-codes is the termination of the trellises as noted by P. Robertson in "Illuminating the Structure of Code and Decoder of Parallel Concatenated Recursive systematic (Turbo) Codes", IEEE Globecom, pp. 1298–1303, November–December, 1994. As with conventional block-oriented non-recursive convolutional codes, it is desirable to have the encoder start and stop in a known state. This is achieved for non-recursive convolutional codes by starting the encoder in a known state (usually the zero state) and then using known flush bits to terminate the encoder. The flush bits are usually zeros to force the encoder back into the zero state (zero-flush). The result is a simple decoder, with all bits well protected, but the flush bits take energy away from the data bits and also lower the code rate or bandwidth efficiency of the code. One solution to this problem is to perform tail-biting as noted by G. Solomon and H. Tilborg in "A Connection Between Block and Convolutional Codes", SIAM J. Appl. Math, Vol. 37, No. 2, pp. 358–369, October, 1979; and by H. Ma and J. Wolf in "On Tail Biting Convolutional Codes", IEEE Trans. on Comm., Vol. COM-34, No. 2, pp. 104–111, February, 1986. Tail biting is a technique where the constraint length k (memory k-1) encoder is initialized with the first k-1 data bits and then flushed at the end of the block with the same k-1 data bits. This eliminates the overhead associated with the flush bits. In this case the starting and ending states are the same, but unknown. Decoding requires more computations, but the increase in complexity is not significant for typical block sizes of several Viterbi decoder history depths. The usual close-to-optimal decoding approach is to decode in a circle, processing at least two extra history depths of signal as noted by Solomon and Tilborg in their previously noted work.

The termination problem is more complicated for Turbo-codes. This is because there are (at least) two trellises to be terminated and the input to the second RSC encoder is an interleaved or permuted version of the input to the first RSC encoder. The most common termination approach is to add termination bits to the end of the first uninterleaved block, resulting in termination of the first trellis, but leave the second trellis unterminated. The first encoder cannot be simply flushed with zero bits because the encoder is recursive. It is straightforward, however, to determine the termination bits required to force the encoder into a given state, such as the zero state. The required termination bits are simply the feedback bits from the RSC encoder at the time of termination.

Termination of both trellises has been achieved by P. Guinand and J. Lodge as documented in "Trellis Termination for Turbo Encoders", Proc. 17th Biennial Symp. On Communications, Queen's University, Kingston, Canada, pp. 389–392, May 30–Jun. 1 1994. This was accomplished by determining a set of termination positions in the input that allow control of both final states and then defining the appropriate mapping to determine the bits to be inserted into these positions. Conceptually this involves running the encoder twice (at most) and does add further overhead in the form of yet more termination bits.

An alternate solution to the problem of terminating the second trellis is the so-called frame-oriented Turbo-code of C. Berrou and M. Jezequel as described in "Frame-Oriented Convolutional Turbo Codes", Elec. Letters, Vol.32, No.15, pp. 1362–1364, July 1996. In this approach, a single trellis is used. A block of input bits, twice as long as the number of data bits, is produced by placing the data bits, in their original order, in the first half of the block and a specially interleaved or permuted copy of the data bits in the second half of the block. This block is then run through a single RSC encoder to generate the parity bits. There are some similarities between this approach and a tail-biting approach in that the flush bits are eliminated without leaving an unterminated end, but full tail biting is not performed. Also, the block size is restricted to be a multiple of the repetition period of the RSC feedback polynomial. For example, the Turbo4 encoder defined in B. Talibart and C. Berrou has a repetition period of 15. This is an undesirable restriction, and represents a significant overhead for some desired block lengths. Full tail biting in this situation would result in an increase in the code rate.

Other tail-biting methods have been mentioned in various papers such as J. Anderson and S. Hladik's "MAP Tail biting Decoders", ISIT, Ulm, Germany, p. 224, Jun. 29–Jul. 4 1997, J. Anderson and S. Hladik's , "Tail biting MAP Decoders", IEEE Journal on Selected Areas in Communications, Vol. 16, No. 2, pp. 297–302, February 1998, Y-P Wang, R. Ramesh, A. Hassan, and H. Koorapaty's, "On MAP Decoding for Tail-Biting Convolutional Codes", ISIT, Ulm, Germany, p. 225, Jun. 29–Jul. 4 1997, H-A Loeliger's, "New Turbo-Like Codes", ISIT, Ulm, Germany, p. 109, Jun. 29–Jul. 4, 1997. None of these schemes is particularly general and/or flexible. The Anderson and Hladik papers make no mention of how to implement tail-biting RSC codes or tail-biting Turbo-codes. Tail-citing Turbo-codes are mentioned in Wang, Ramesh, Hassan and Koorapaty, as well as in H-A Loeliger but these papers place restrictions on the feedback polynomial and block length of the tail-biting RSC component codes. These restrictions, though undesirable, are necessary because these codes are designed to be strictly systematic, that is, all the data bits are encoded and represented directly in the systematic output of the code.

In the following discussion, various known method of either terminating or tail biting the output of a Turbo encoder will be discussed. In the discussion, the term "symbol" will be used to refer to either a bit or an arbitrary non-binary symbol. The associated RSC and Turbo decoders are also described. One can consider the number of data or information bits per block to be K and the total number of code bits is N. Thus, the exact code rate for a block Turbo-code is always r=K/N. The memory of each RSC encoder is typically the same and given by m=k−1, where k is the RSC encoder constraint length. In some cases the m parameter will be used to represent a value less than or equal to the memory of k−1. In most cases the Turbo encoder is constructed from two RSC encoders though extensions to more than two RSC encoders are also made. Binary rate ½ RSC encoders are also generally assumed, but the various approaches are not restricted to rate ½ RSC codes of to binary symbols (bits).

One method is to use two unterminated RSC codes as is illustrated in FIG. 1. In this case, both RSC encoders start in the zero-state (or any known state) and are left unterminated in an unknown state after the K data bits are encoded. The data bits are interleaved prior to entering the second RSC encoder, so that two different permutations of the data are used, the first typically being the identity permutation (no interleaving).

One problem with this approach is that the end bits are poorly protected. A good interleaver would ensure that bits near the end of the first permutation are not near the end of the second permutation, but even so, the end bits still have less protection than the other bits. The opposite is true for the start bits. These bits are overly protected because of the known starting state. With an RSC code rate of ½, the overall unpunctured Turbo-code rate is ⅓. This is because the data bits are only sent over the channel once. Other Turbo-code rates are also possible with different starting RSC code rates and puncturing.

Another approach is to use one terminated and one unterminated RSC code as illustrated in FIG. 2. This method is the most common approach found in the literature. In this case, the first RSC encoder starts in the zero state, and m termination bits are added to the K data bits to force the first RSC encoder to also stop in the zero state. The termination bit values are uniquely determined by the state of the first RSC encoder after the last data bit. The termination bits are easily calculated to match the feedback as required, or they can be precalculated for each possible encoder state and stored in a table. The resulting K+m bits are then interleaved and sent to the second RSC encoder. Note that the m termination bits (denoted by "t" in FIG. 2) are included in the interleaver. The second RSC encoder also starts in the zero state but is left unterminated in an unknown state after the K+m interleaved bits are encoded. This approach typically works better than the previous approach because fewer bits are near an unterminated end. Of course, the bits near the end of the second permutation still receive less protection than the other bits. Another drawback is the reduced code rate, due to the addition of the termination bits. With an RSC code rate of ½ the overall unpunctured Turbo-code rate is K/(3(K+m)). For example, with K=100 and m=4, the code rate is 0.321.

Yet another approach is to use two terminated RSC Codes as shown in FIG. 3. This method was first introduced by Guinand and Lodge and it is highly effective for large data blocks. In this case, both RSC encoders start in the zero state, and 2m termination bits are added to the K data bits to force both encoders to also end in the zero state. A summary of this prior art method is as follows.

Given a specific block size (including room for 2m termination bits, denoted b "t" in FIG. 3) and a specific interleaver, the first step is to find a set of termination positions within the input data block that can be used to force the ending states of both RSC encoders to be zero. The total ending state (the ending states of both RSC encoders) is defined by a linear mapping from the K+2m input bits to the 2m bits defining the total ending state. Let the rank of this mapping matrix to be denoted by rank. In general rank will be less than or equal to 2m, with the rank achieving its maximum value for most encoders and interleavers of interest. It is assumed that rank=2m in the following discussion, but this is not necessary. Any rank linearly independent columns of the mapping matrix span the range of the linear map. Thus, the total ending state can be forced to zero by selecting the appropriate inputs for these rank columns of the mapping matrix. In general, the last rank positions may not be linearly independent. However, the last m positions will correspond to linearly independent columns of the matrix. Finding the remaining m positions uses a search procedure involving sending impulse signals into the dual RSC encoder and observing the output to see if the resulting total ending state is linearly independent of the total ending states already found. This procedure is continued until one has rank linearly independent total ending states. Note that the determination of the 2m positions is independent of the input data so that this step only needs to be performed during the initial code design. The inverse of the rank-by-rank matrix mapping the termination bits to the total ending state of the dual RSC encoder can also be precomputed. More details are given in Guinand and Lodge's paper.

Encoding can then be performed as follows. First, the data bits are placed into the non-termination positions of the uninterleaved input block, and the termination positions are filled with zeros. This block is interleaved and the two permutations are passed through the dual RSC encoder. Multiplying the total ending state by the inverse matrix described above gives the termination bits to be inserted into the termination positions. After inserting the termination bits into both permutations, the dual RSC encoder is run again to obtain the final encoded sequence.

The termination positions are not uniquely defined. There are many possible choices for a set of termination positions. If the positions are chosen close to the end of the uninterleaved block, as shown in FIG. 3, then the second encoding of the uninterleaved block can be simplified. That is, the first RSC encoder can start its second pass at the first non-zero termination bit, which is near the end of the block. The second RSC encoder can also start its second pass at the first interleaved non-zero termination bit, but the reduction in processing will typically be small because the termination positions will be spread throughout the interleaved block. Thus, the dual termination Turbo encoder typically requires about 50% more processing than the conventional Turbo encoder. This is of little consequence since the processing required by the Turbo decoder typically overshadows that required by the Turbo encoder. Table lookup techniques can also be used to trade off memory for processing in the encoder.

The advantage of the dual termination method over the previous methods is that all bits now have good protection. The disadvantage is that the code rate is reduced even further, due to the use of 2m termination bits. With an RSC code rate of ½ the overall unpunctured Turbo-code rate is $K/(3(K+2m))$. For example, with K=100 and m=4, the code rate is 0.309.

As mentioned earlier, another solution to the problem of terminating the second trellis is the so-called frame-oriented Turbo-code of C. Berrou and M. Jezequel. In this approach a single trellis is used that both starts and ends in the zero state. A block of input bits twice as long as the number of data bits is produced by placing the data bits, in their original order, in the first half of the block and a specially interleaved copy of the data bits in the second half of the block. This block is then run through a single RSC encoder to generate the parity bits. The final termination of the trellis is a result of a special interleaver structure. If p is the repetition of the RSC encoder, then the block size is restricted to be a multiple of p. The repetition period of an RSC encoder is determined by the feedback polynomial. Good choices for the feedback polynomial appear to be those that generate maximal-length sequences, also called m-sequences. Thus, the repetition period is usually given by $p=2^m-1$ for good RSC encoders. For example, the Turbo4 encoder defined in B. Talibart and C. Berrou has a repetition period of p=15. This is an undesirable restriction, and may represent a significant overhead for some desired block sizes. The interleaver design is also restricted such that the two occurrences of each systematic bit must be a multiple of p apart. It is this restriction that forces the encoder back into the zero state once every systematic bit has been encountered twice. This is also an undesirable constraint on the interleaver.

With respect to Turbo decoding, some prior art tail-biting methods have been mentioned in various papers such as J. Anderson and S. Hladik's "MAP Tail biting Decoders", ISIT, Ulm, Germany, p. 224, Jun.29–Jul. 4, 1997, J. Anderson and S. Hladik, "Tail biting MAP Decoders", IEEE Journal on Selected Areas in Communications, Vol. 16, No. 2, pp. 297–302, February 1998, Y-P Wang, R. Ramesh, A. Hassan, and H. Koorapaty, "On MAP Decoding for Tail-Biting Convolutional Codes", ISIT, Ulm, Germany, p. 225, Jun. 29–Jul. 4, 1997, H-A Loeliger, "New Turbo-Like Codes", ISIT, Ulm, Germany, p. 109, Jun. 29–Jul. 4, 1997. As mentioned earlier, none of these schemes is particularly general and/or flexible. Two tail-biting MAP decoding algorithms are described in the Anderson and Hladik papers previously mentioned. The first algorithm is a true MAP decoder for tail-biting blocks, and is very complicated. The second Algorithm is more practical, and performs MAP decoding in a circle with overlap, analogous to the overlap method used for the Viterbi decoding of non-recursive convolutional tail-biting block codes.

SUMMARY OF THE INVENTION

An object of this invention is to provide an improved data transmission rate in digital communications, using turbo codes.

It is another object of this invention to provide tail biting on a plurality of RSC encoders within a Turbo encoder without requiring extra termination bits.

It is yet another object of this invention to provide a method of terminating the RSC encoders within a Turbo encoder such that it provides a more evenly distributed degree of protection across the entire block of data.

It is a further object of this invention to provide an improved turbo encoding scheme, tuned for shorter block lengths that is based upon a plurality of trellises and recursive systematic convolutional (RSC) coding with more flexibility in selecting a block length and interleaver design.

It is also an object of this invention to provide a relatively flexible and simplified method of decoding tail biting Turbo encoded data.

Unlike the schemes presented by Wang, Ramesh, Hassan and Koorapaty in "On MAP Decoding for Tail-Biting Convolutional Codes", ISIT, Ulm, Germany, p. 225, Jun. 29–Jul. 4, 1997, or Loeliger in "New Turbo-Like Codes", ISIT, Ulm, Germany, p. 109, Jun. 29–Jul. 4, 1997, the scheme presented here is both general and flexible. Two tail biting maximum a priori (MAP) decoding algorithms are described by Anderson and Hladik in, "MAP Tailbiting Decoders", ISIT, Ulm, Germany, p. 224, Jun. 29–Jul. 4, 1997, and in, "Tailbiting MAP Decoders", IEEE Journal on Selected Areas in Communications, Vol. 16, No. 2, pp. 297–302, February, 1998. The first algorithm, a true MAP decoder for tail-biting blocks, is very complicated. The second algorithm is more practical, and performs MAP decoding in a circle with overlap, analogous to the overlap method used for the Viterbi decoding of non-recursive convolutional tail-biting block codes. The Anderson and Hladik papers make no mention of how to implement tail-biting RSC codes or tail-biting Turbo-codes. Tail-biting Turbo-codes are mentioned in Wang, Ramesh, Hassan and Koorapaty, as well as in Loeliger. These papers place restrictions on both the feedback polynomial and block length of the tail-biting RSC component codes. These restrictions are necessary because these codes are designed to be strictly systematic, that is, all the data bits are encoded and represented directly in the systematic output of the code. These restrictions do not apply to the new tail-biting approaches presented here because, among other reasons, these new tail-biting turbo-codes are not strictly systematic.

A new tail-biting frame-oriented Turbo-code is also described. The advantage over the original frame-oriented Turbo-code is that the code rate is increased, due to the inclusion of m extra data bits. The disadvantage is that now a full tail-biting Turbo decoder is required. This only increases the decoding complexity slightly. The complexity of the encoder is not increased in this case. With an RSC code rate of ½ the overall unpunctured Turbo-code rate is $K/(3(K-m))$, where K-m must be a multiple of p. For example, with m=4, p=15, and K=124, the unpunctured code-rate is 0.344.

In accordance with a first aspect of the current invention there is provided a method of encoding a raw data set of ordered symbols comprising the steps of first, providing a recursive systematic convolutional (RSC) encoder. The second step is to divide the raw data set into first and second data subsets. The third step is to use the first data subset to determine a starting state for the RSC encoder, such that the starting state uniquely corresponds to the first data subset. The fourth step is to use the starting state determined in the third step to initialize the RSC encoder. The fifth step is to derive a systematic set from the first and second data subsets. The sixth step is to encode the systematic set using the RSC encoder to generate a parity set of ordered symbols. The first embodiment of the first aspect of this invention defines that the RSC encoder has a memory size not less than 1, the raw data set and the systematic set each have K ordered symbols, the first and second data subsets have cardinalities of m and K–m respectively, where $1 \leq m \leq$ "memory size of the RSC encoder", and adds the following steps to the method of the first aspect. The seventh step is to define a position set of K ordered positions to be filled with the systematic set. The eighth step is to divide the position set into first and second position subsets having cardinalities of m and K–m respectively, such that each position in the first subset independently influences an ending state of the RSC encoder upon completion of the encoding step, when it is filled with a symbol from the systematic data set. The ninth step is to fill the second position subset with the elements from the second data subset to form a portion of the systematic set. The tenth step is to use the starting state, the first position subset and the portion of the systematic set, determined in step eight, to determine a tail-biting set of m ordered symbols, such that the tail-biting set forces the ending state to be the same as the starting state. The eleventh step is to fill the first position subset with the tail-biting set to complete the systematic set contained in the position set. This process will force the ending state to be the same as the starting state upon completion of the encoding step. The second embodiment of the first aspect adds an additional four steps, and may be applied to either the initial aspect, or the embodiments thereof. The first additional step is to define the first permutation as being the same as the systematic set. The second additional step is to generate at least one further permutation of the systematic set. The third additional step is to provide at least one further systematic convolutional encoder. The fourth additional step is to encode the at least one further permutation using the at least one further encoder to generate at least one other parity set of ordered symbols. In addition, all embodiments of the first aspect of the invention can be modified by the addition of at least one further convolutional encoder, wherein the encoding step uses the RSC encoder operating in series with the further encoder.

In accordance with a second aspect of the current invention, a method of encoding a raw data set of K ordered symbols is defined to comprise the following steps. The first step is to provide a plurality P of recursive systematic convolutional (RSC) encoders each having a memory size not less than 1. The second step is to provide P-1 interleavers that each interleave K ordered symbols. The third step is to divide the raw data set of ordered symbols into first and second data subsets of cardinalities M and K–M respectively, where M is at least one and at most the sum of the memory sizes of the P RSC encoders. The fourth step is to determine a vital starting state consisting of P individual starting states which correspond to the P RSC encoders from the first data subset, such that the total starting state uniquely corresponds to the first data subset. The fifth step is the initialization of the P RSC encoders with the corresponding P individual starting states that were determined in step four. The sixth step is to define a position set of K ordered positions to be filled with a systematic set. The seventh step is to divide the position set into first and second position subsets of cardinalities M and K–M respectively, based on the P-1 interleavers, such that each position in the first position subset when filled with a symbol from the systematic set independently influences a total ending state consisting of P individual ending states corresponding to the P RSC encoders. The eighth step is to fill the second position subset with the second data subset to form a portion of the systematic set. The ninth step is to use the total starting state, the first position subset, portion of the systematic set determined in step eight, and the P-1 interleaves to determine a tail-biting set, of cardinality M, such that the tail-biting set forces the total ending state to be the same as the total starting state. The tenth step is to fill the first position subset with the tail-biting set, to complete the systematic set contained in the position set. The eleventh step is to interleave the systematic set P-1 times using the P-1 interleavers to form P permutations. The twelfth step is to encode each of the P permutations, from step eleven, using a corresponding RSC encoder, from the P RSC encoders, to generate P respective parity sets of ordered symbols, thereby forcing the total ending state to be the same as the total starting state. In an embodiment of the present invention each of the P RSC encoders has a memory size of $m_n$, for n=0... P-1, where $m_n$ is at least one and each of the P RSC encoders has an individual state defined respectively by an individual state set of $m_n$ ordered state symbols, for n=0... P-1, where M equals the sum of all values of $m_n$, for n=0... P-1, and where a total state requires a total state set of M ordered state symbols.

In accordance with a third aspect of the current invention there is provided a method of encoding a raw data set of K ordered symbols comprising of the following 13 steps. The first step is to provide a recursive systematic convolutional (RSC) encoder having a memory size of at least one. The second step is to provide a plurality P-1 of ordered interleavers each for interleaving K ordered symbols. The third step is to divide the raw data set into first and second data subsets of cardinalities m and K–m, where $1 \leq m \leq$ "memory size of the RSC encoder". The fourth step is to determine a starting state for the RSC encoder from the first data subset, such that the starting state uniquely corresponds to the first data subset. The fifth step is to initialize the RSC encoder with the starting state determined in the fourth step. The sixth step is to define a position set, of cardinality K, to be filled with a systematic set. The seventh step is to divide the position set, defined in the sixth step, into first and second position subsets, of cardinalities m and K–m respectively, based on the P-1 interleavers, such that each position in the first position subset when filled with a symbol from the systematic set independently influences an ending state of the RSC encoder. The eighth step is to fill the second position subset with the second data subset, thereby forming a portion of the systematic set. The ninth step is to use the starting state, the first position subset, said portion of the systematic set, and the P-1 ordered interleavers to determine a tail-biting set, of cardinality m, such that the tail-biting set forces the ending state to be the same as the starting state. The tenth step is to fill the first position subset with the tail-biting set to complete the systematic set contained in the position set. The eleventh step is to interleave the systematic set P-1 times using the P-1 ordered interleavers to form P ordered permutations. The twelfth step is to form a contiguous block from the P ordered permutations created in step eleven. The thirteenth step is to encode the contiguous block, formed in step twelve, using the RSC encoder to generate P parity sets of ordered symbols, corresponding to the P ordered permutations, thereby forcing the ending state to be the same as the starting state.

In accordance with a fourth aspect of the current invention there is provided a method of encoding a raw data set of K ordered symbols comprising the following eight steps. The first step is to provide a recursive systematic convolutional (RSC) encoder having a memory size of at least one and a repetition period p. The second step is the division of the raw data set into first and second data subsets, of cardinalities, m and K–m respectively, where $1 \leq m \leq$ "memory size of the RSC encoder", and K––m is a multiple of the repetition period, p. The third step is to use the first data subset to determine a starting state for the RSC encoder, such that the starting state uniquely corresponds to the first data subset. The fourth step is to use the starting state defined in the third step to initialize the RSC encoder. The fifth step is to define a position set of K–m ordered positions to be filled with the second data subset, thereby forming a systematic set. The sixth step is to provide a plurality P-1 of ordered interleavers for interleaving the systematic set P-1 times to form P ordered permutations of the systematic set, where P is a multiple of 2, such that each symbol in each permutation is paired with the same symbol in a different permutation at a distance of an integer multiple of p. The seventh step is to form a contiguous block from the P ordered permutations of step six. The eighth step is to encode the contiguous block of step seven using the RSC encoder to generate P parity sets of ordered symbols, corresponding to the P ordered permutations, thereby forcing an ending state to be the same as the starting state.

Embodiments of the first four aspects of the invention where ever applicable, may have m equal to the memory size of the RSC encoder, and the RSC encoder have a state defined by a state set of m ordered state symbols. Additionally further embodiments are defined wherein the state set required to define the starting state is determined directly from the first data subset, and, wherein the first data subset is extracted from the raw data set using the first position subset.

In accordance with a fifth aspect of the current invention there is provided a method of decoding a set of ordered samples representing a set of ordered symbols encoded according to the method described as the first aspect of the current invention, comprising two steps. The first step is to obtain an estimate of the starting state using a method of state estimation. The second step is to map the estimate of the starting state, obtained in step one, to an estimate of the first data subset. An embodiment of this fifth aspect of the current invention is to base the method of state estimation, used in the first step, on maximum likelihood state estimation.

In accordance with a sixth aspect of the current invention there is provided a method of decoding a set of ordered symbols encoded according to the method described in the first embodiment of the first aspect of the current invention, comprising three steps. The first step is to estimate the second data subset using a method of data estimation. The second step is to obtain an estimate of the starting state using a method of state estimation. The third step is to map the estimate of the starting state, obtained in the second step, to an estimate of the first data subset. Further embodiments of this aspect of the invention use, a method of data estimation based upon maximum likelihood sequence estimation with overlapped processing, a method of data estimation based on maximum a posteriori probability data estimation with overlapped processing, and a method of state estimation based on maximum likelihood state estimation with overlapped processing, either alone or in conjunction with each other.

In accordance with a seventh aspect of the current invention there is provided a method of decoding a set of ordered samples representing a set of K ordered symbols encoded according to the method described in the second aspect of the current invention, comprised of three steps. The first step is to estimate the second data subset using a method of iterative data estimation. The second step is to obtain an estimate of the total starting state, consisting of estimates of all individual starting states of the P RSC encoders, where each individual starting state estimate is determined using a method of state estimation. The third step is to map the estimate of the total starting state, obtained in the second step, to an estimate of the first data subset.

In accordance with an eighth aspect of the current invention there is provided a method of decoding a set of ordered samples representing a set of K ordered symbols encoded according to the method described in the third embodiment of the present invention, comprised of three steps. The first step is to estimate the second data subset using a method of iterative data estimation. The second step is to obtain an estimate of the starting state using a method of state estimation. The third step is to map the estimate of the starting state, obtain in step 2, to an estimate of the first data subset.

In accordance with a ninth aspect of the current invention there is provided a method of decoding a set of ordered samples representing a set of K ordered symbols encoded according to the method described in the fourth aspect of the current invention, comprised of three steps. The first step is to estimate the second data subset using a method of iterative data estimation. The second step is to obtain an estimate of the starting state using a method of state estimation. The third step is to map the estimate of the starting state, obtained in the second step, to an estimate of the first data subset.

The seventh, eighth, and ninth aspects all have embodiments that use, either one or both of the following modifications: a method of iterative data estimation that is based upon iterative a posteriori probability data estimation with overlapped processing, and a method of state estimation based upon maximum likelihood state estimation with overlapped processing.

In accordance with a tenth aspect of the current invention there is provided an apparatus for encoding a raw data set of ordered symbols comprised of three components. The first component is a recursive systematic convolutional (RSC) encoder. The second component is a buffer means for dividing the raw data set into first and second data subsets. The third component is a reset means for initializing the RSC encoder with a starting state based on the first data subset, such that the starting state uniquely corresponds to the first data subset, such that the RSC encoder encodes a systematic set derived form the first and second data subsets, to generate a parity set of ordered symbols. In an embodiment of this aspect of the present invention there is an encoder defining a first permutation as being the same as the systematic set, also consisting of a fourth and fifth component. The fourth component is an interleaver for generating a further permutation of the systematic set. The fifth component is a further systematic convolutional encoder for encoding said other permutation to generate a further parity set of ordered symbols. A further embodiment of this aspect of the invention is an encoder as described above further comprising a further convolutional encoder operating in series with the RSC encoder.

The enhancement of a decoding method for tail biting codes would facilitate increasing the data rate of communications systems, for small codeword length systems, by allowing the removal of flush bits while maintaining the docoder's ability to correct errors due to noise.

In accordance with an eleventh aspect of the current invention there is provided an apparatus for encoding a raw data set of K ordered symbols comprised of four elements. The first element is a recursive systematic convolutional (RSC) encoder having a memory size of at least one. The second element is a buffer means for dividing the raw data set into first and second data subsets containing m and K–m ordered symbols respectively, where m is at least one and at most the memory size of the RSC encoder. The third element is a reset means for initializing the RSC encoder into a starting state based on the first data subset, such that the starting state uniquely corresponds to the first data subset. The fourth element is a tail-biting means for generating a tail-biting set of m ordered symbols based on the starting state, and the second data subset, such that the tail-biting set forces an ending state to be the same as the starting state, such that the RSC encoder encodes a systematic set consisting of a combination of the second data subset and the tail-biting set to generate a parity set of ordered symbols, thereby forcing the ending state to be the same as the starting state. An embodiment of the eleventh aspect of the current invention is an encoder as described above, wherein m equals the memory size of the RSC encoder, and the RSC encoder has a state defined by a state set of m ordered state symbols, such that the state set required to define the starting state is determined directly from the first data subset.

In accordance with a twelfth aspect of the current invention there is provided an apparatus for encoding a raw data set of K ordered symbols comprised of five elements. The first element is a plurality P of recursive systematic convolutional (RSC) encoders each having a memory size of at least one. The second element is P-1 interleavers each for interleaving K ordered symbols. The third element is a buffer means for dividing the raw data set into first and second data subsets containing M and K–M ordered symbols respectively, and for further subdividing the first data subset into P individual first data subsets containing $m_n$ ordered symbols, for n=0... P-1 where $m_n$ is at least one and at most the memory size of the n'th RSC encoder and where M is the sum of the P values of $m_n$. The fourth element is a reset means for initializing each of the P RSC encoders into an individual starting state based on the corresponding individual first data subset, such that the individual starting state uniquely determines the individual first data subset. The fifth element is a tail-biting means for generating a tail-biting set of M ordered symbols based on a total starting state consisting of the individual starting states of the P RSC encoders, the second data subset, and the P-1 interleavers, such that the tail-biting set forces a total ending state consisting of individual ending states of the P RSC encoders to be the same as the total starting state, such that firstly each interleaver interleaves a systematic set consisting of a combination of the second data subset and the tail-biting set to form P permutations of the systematic set; and secondly each RSC encoder encodes one of said P permutations to generate P respective parity sets of ordered symbols, thereby forcing the total ending state to be the same as the total starting state. An embodiment of the twelfth aspect of the current invention is an encoder as described above wherein $m_n$ equals the memory size of the n'th RSC encoder, and n'th RSC encoder has an individual state defined by an individual state set of $m_n$ ordered state symbols, such that the n'th individual state set required to define the n'th individual starting state is determined directly from the n'th individual first data subset.

In accordance with a thirteenth embodiment of the current invention there is provided an apparatus for encoding a raw data set of K ordered symbols comprised of five elements. The first element is a recursive systematic convolutional (RSC) encoder having a memory size of at least one. The second element is a plurality P-1 of interleavers each for interleaving K ordered symbols. The third element is a buffer means for dividing the raw data set into first and second data subsets containing m and K–m ordered symbols respectively, where m is at least one and at most the memory size of the RSC encoder. The fourth element is a reset means for initializing the RSC encoder with a starting state based on the first data subset, such that the starting state uniquely corresponds to the first data subset. The fifth element is a tail-biting means for generating a tail-biting set of m ordered symbols based on the starting state, the second data subset, and the P-1 interleavers, such that the tail-biting set forces an ending state to be the same as the starting state, such that each interleaver interleaves a systematic set consisting of a combination of the second data subset and the tail-biting set to form P permutations of the systematic set and that the RSC encoder encodes a contiguous block consisting of said P permutations to generate P parity sets of ordered symbols, thereby forcing the ending state to be the same as the starting state. An embodiment of this thirteenth aspect is an encoder as described above, wherein m equals the memory size of the RSC encoder, and the RSC encoder has a state defined by a state set of m ordered state symbols, such that the state set required to define the starting state is determined directly from the first data subset.

In accordance with a fourteenth embodiment of the current invention there is provided an apparatus for encoding a raw data set of K ordered symbols comprised of four elements. The first element is a recursive systematic convolutional (RSC) encoder having a memory size of at least one and a repetition period p. The second element is a buffer means for dividing the raw data set into first and second data subsets containing m and K–m ordered symbols respectively, where m is at least one and at most the memory size of the RSC encoder, and K–m is a multiple of p. The third element is a plurality P-1 of interleavers each for interleaving K–m ordered symbols, where P is a multiple of 2. The fourth element is a reset means for initializing the RSC encoder with a starting state based on the first data subset, such that the starting state uniquely corresponds to the first data subset, such that each interleaver interleaves a systematic set consisting of the second data subset to form P permutations of the systematic set, such that each symbol in each permutation is paired with the same symbol in a different permutation at a distance of an integer multiple of p and that the RSC encoder encodes a contiguous block consisting of said P permutations to generate P parity sets of ordered symbols, thereby forcing an ending state to be the same as the starting state. An embodiment of this fourteenth aspect of the current invention is a turbo encoder as described above, wherein m equals the memory size of the RSC encoder, and the RSC encoder has a state defined by a state set of m ordered state symbols, such that the state set required to define the starting state is determined directly from the first data subset.

In accordance with a fifteenth embodiment of the current invention there is provided an apparatus for decoding a set of ordered samples representing a set of ordered symbols encoded according to the method described in the first aspect of the present invention, comprised of three elements. The first element is a data estimator for obtaining an estimate of the second data subset. The second element is a state estimator for obtaining an estimate of the starting state. The third element is a mapper responsive to the state estimator to map the estimate of the starting state to an estimate of the first data subset.

In accordance with a sixteenth embodiment of the current invention there is provided an apparatus for decoding a set of ordered samples representing a set of ordered symbols encoded according to the method described in the first embodiment of the first aspect of the current invention, comprised of three elements. The first element is a data estimator for obtaining an estimate of the second data subset. The second element is a state estimator for obtaining an estimate of the starting state. The third element is a mapper responsive to the state estimator to map the estimate of the starting state to an estimate of the first data subset.

In accordance with a seventeenth embodiment of the current invention there is provided an apparatus for decoding a set of ordered samples representing a set of K ordered symbols encoded according to the method described in the second aspect of the current invention, comprised of three elements. The first element is a data estimator for obtaining an estimate of the second data subset using a method of iterative data estimation. The second element is a state estimator for obtaining an estimate of the total starting state, consisting of estimates of all individual starting states of the P RSC encoders. The third element is a mapper responsive to the state estimator to map the estimate of the total starting state to an estimate of the first data subset.

In accordance with an eighteenth embodiment of the current invention there is provided an apparatus for decoding a set of ordered samples representing a set of K ordered symbols encoded according to the method described in the third embodiment of the current invention comprised of three elements. The first element is a data estimator for obtaining an estimate of the second data subset using a method of iterative data estimation. The second element is a state estimator for obtaining an estimate of the starting state. The third element is a mapper responsive to the state estimator to map the estimate of the starting state to an estimate of the first data subset.

In accordance with a nineteenth embodiment of the current invention there is provided an apparatus for decoding a set of ordered samples representing a set of K ordered symbols encoded according to the method described in the fourth aspect of the current invention, comprised of three elements. The first element is a data estimator for obtaining an estimate of the second data subset using a method of iterative data estimation. The second element is a state estimator for obtaining an estimate of the starting state. The third element is a mapper responsive to the state estimator to map the estimate of the starting state to an estimate of the first data subset.

BRIEF DESCRIPTION OF THE DRAWINGS

Exemplary embodiments of the invention will now be further described with references to the drawings.

DESCRIPTION OF INVENTION

In the following description, Turbo-codes are considered to be based on two or more RSC codes with interleaving of the data bits between the RSC encoders, whereas Turbo decoding is considered to involve iterative APP decoding of the channel corrupted RSC code outputs received by the decoder. The following discussion generally assumes Turbo-codes with two RSC codes, but the same inventive principles can be generalized to Turbo-codes with more than two encoders, not all of which are necessarily RSC encoders. The emphasis is therefore on the APP decoding of a single RSC code output. If a particular RSC code is terminated or unterminated then APP decoding proceeds according to prior art methods.

Figure 1:
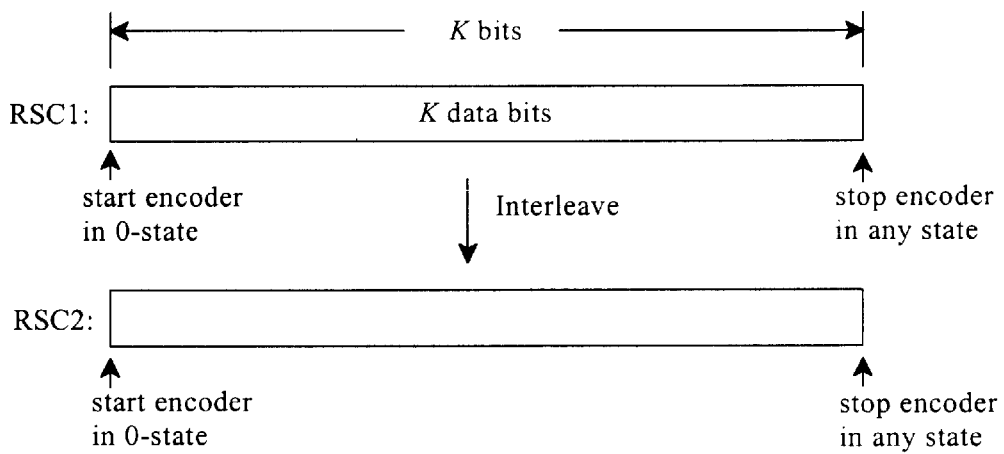
FIG. 1 illustrates two unterminated RSC encoders as used in Prior Art.
Figure 2:
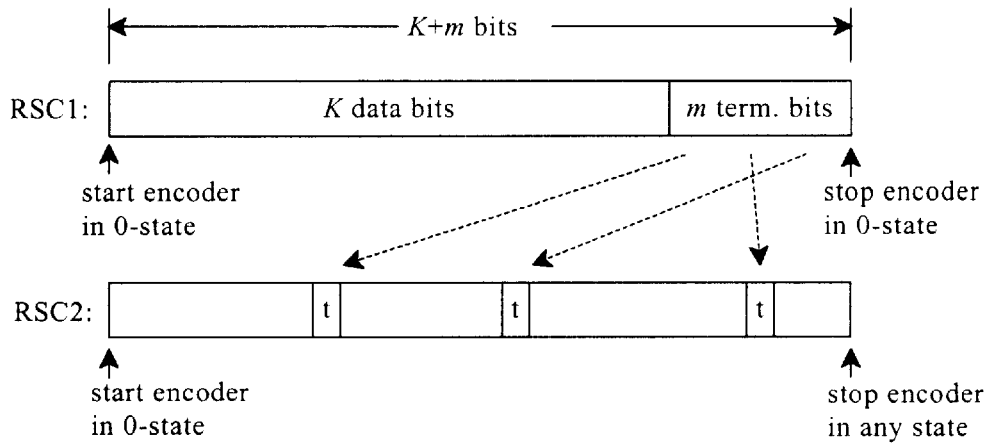
FIG. 2 illustrates one terminated and one unterminated RSC encoders as used in Prior Art.
Figure 3:
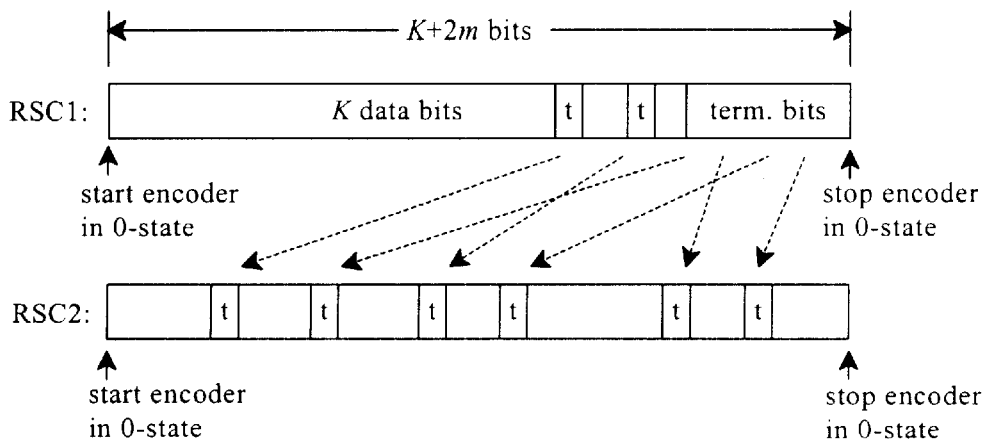
FIG. 3 illustrates two terminated RSC encoders as used in Prior Art.
Figure 4:
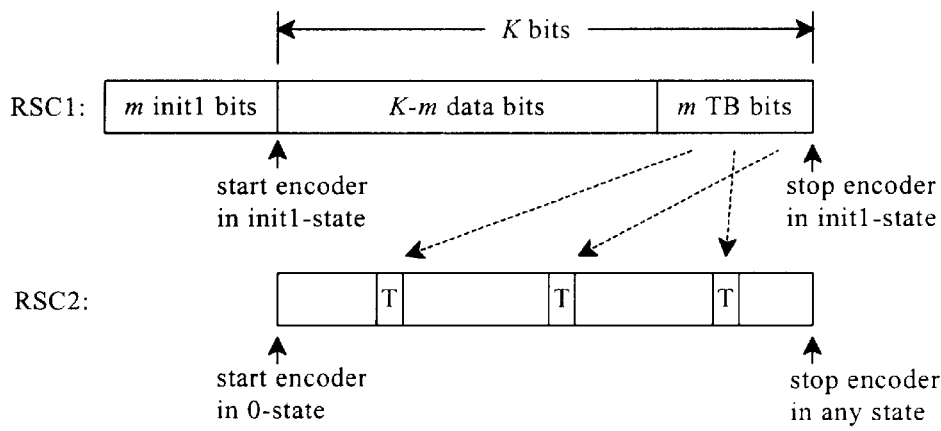
FIG. 4 illustrates one tail-biting, one unterminated RSC encoders in accordance with an embodiment of the invention.

A first main embodiment of Turbo-code encoding in accordance with this invention uses one tail-biting and one unterminated RSC code. This is illustrated in FIG. 4. In this embodiment, the second RSC code is left unterminated, but the first RSC code is tail-biting rather than terminated in the zero state. The tail-biting RSC code is implemented as follows. The first m data bits (or any ordered subset of m data bits), also referred to as the first data subset (of cardinality m), are not sent and not encoded directly by the first RSC encoder. Rather, these m data bits are simply used to initialize the starting state for the first RSC encoder. Any unique mapping will work, but the preferred choice is to simply use the m data bits directly as the m-bit starting state (init1). The remaining K–m data bits, also referred to as the second data subset, are then encoded with the first RSC encoder starting in state init1. The next step is to append m tail-biting (TB) bits to the data sequence (or include them elsewhere within the data sequence) to force the first RSC encoder to end in state init1. Unlike prior art approaches the ending state in this embodiment is not zero but init1, as determined by the selected subset of m data bits in order to avoid a reduction in the code rate. With an RSC code rate of ½ the overall unpunctured Turbo-code rate is exactly ⅓. The values of the TB bits, also referred to as the symbols of the tail-biting set, are easily determined by the state of the first RSC encoder after the last data bit in encoded. The result, after including the TB bits in the encoding, is that the block is encoded in a circle, or is tail-biting.

The resulting K systematic bits, also referred to as a systematic set (of K ordered symbols) are then interleaved and sent to the second RSC encoder. Note that the m TB bits (denoted by T in FIG. 4) are included in the interleaver, but the initial m data bits, used to determine init1, are not. The second RSC encoder starts in the zero state but is left unterminated in an unknown state after the K interleaved systematic bits are encoded. One problem with this approach is that the bits near the end of the interleaved block still receive less protection than the other bits.

This Turbo-code encoder is not strictly systematic because the initial m data bits are not represented directly by the systematic bits of the code, but are represented indirectly by the m TB bits in order to provide more encoding flexibility. There are, therefore, no restrictions on the generator polynomials, the block length, or the interleaver structure. When decoding, the most likely starting state number determines the initial m data bits.

Figure 9:
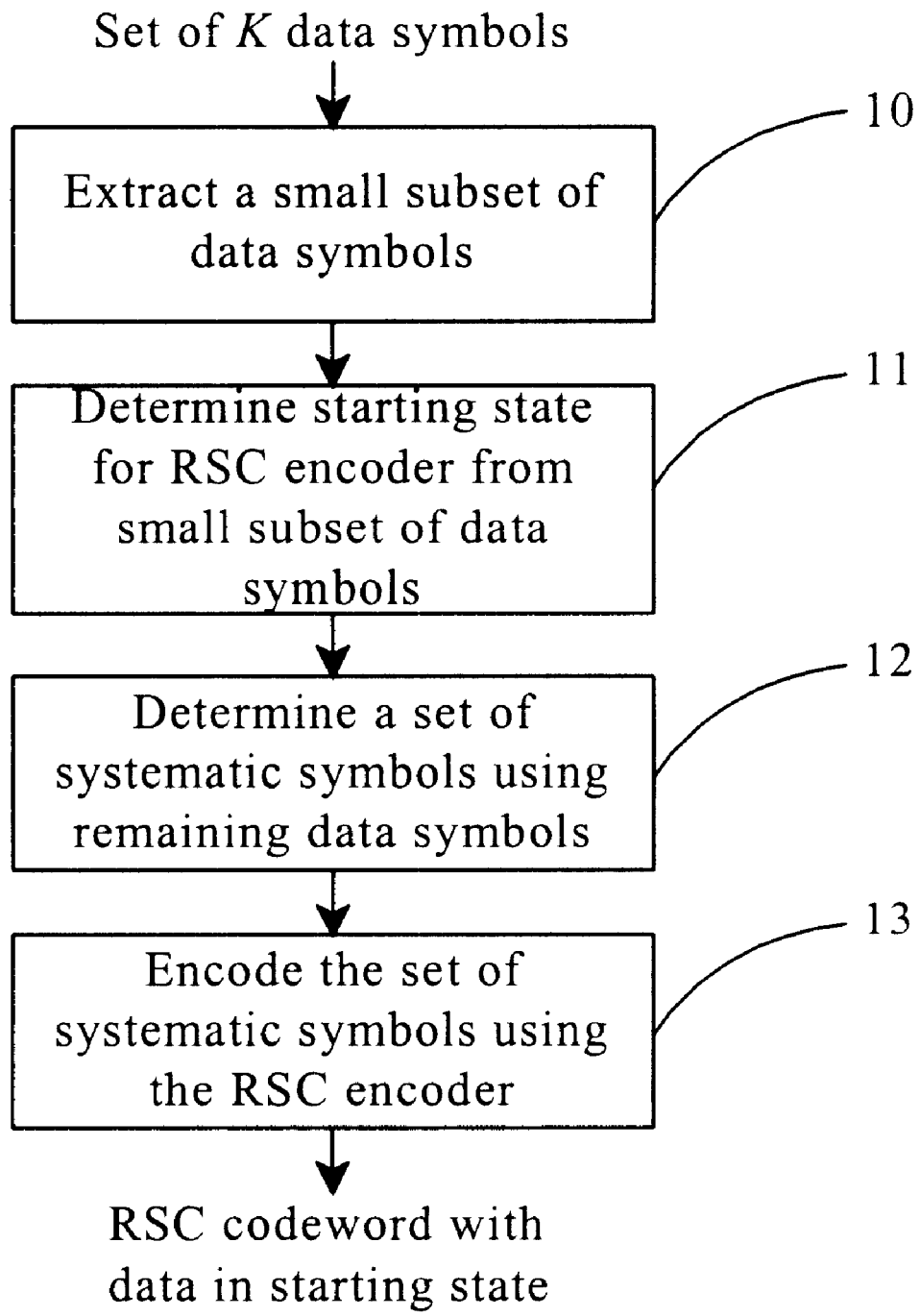
FIG. 9 illustrates a generalized embodiment wherein the first K bits are used in the first encoder depicted in FIG. 4, and wherein the m init1 bits and the K–m data bits are used in the first encoder.

In some particular embodiments the TB bits are precalculated and stored in a table. A table is not necessary, however, as the calculations are trivial. Alternative encoding methods associated with this are described in FIGS. 9, 10, and 11. In the embodiment of FIG. 9, the encoder is provided with a raw data set, to which it performs several steps. In a first step 10, the encoder extracts from the aforementioned raw data set a small subset of the symbols, henceforth referred to as the first data subset. In a second step, 11, the first data set is used to determine a starting state of the RSC encoder. In a third step, 12, the encoder uses the symbols of the complement of the first data subset, henceforth called the second data subset, to determine the systematic set. In a fourth step, 13, the encoder encodes the systematic set, using the first encoder. This process yields an RSC codeword with data in a starting state. This process is in a part of FIG. 4 with respect to the m init1 bits (the first data subset, extracted in the first step 10) and the K–m data bits (the second data subset) that are used in the first encoder.

Figure 10:
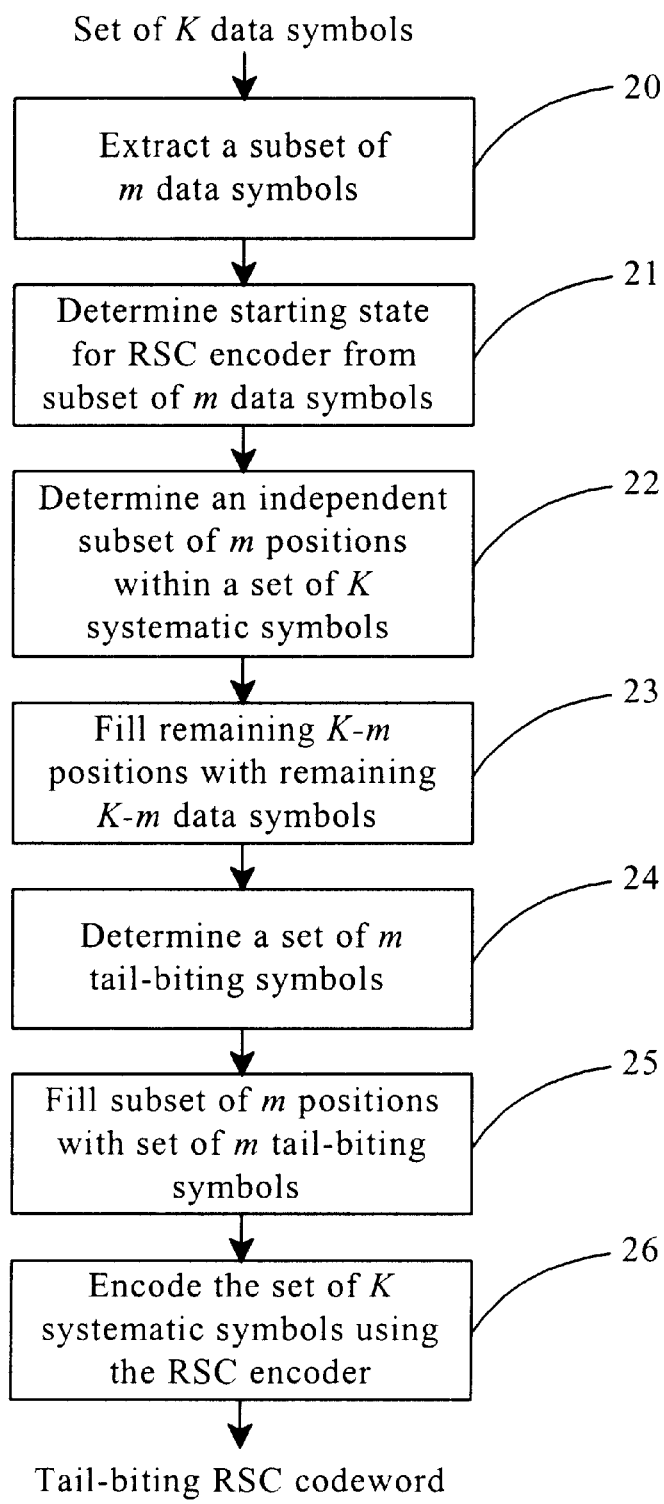
FIG. 10 illustrates another embodiment wherein the first K+m bits are used in the first encoder depicted in FIG. 4, and wherein the m init1 bits, the K–m data bits, and the tail-biting set of m ordered symbols form the complete input to the first encoder.

In accordance with an embodiment shown in FIG. 10, an encoder is provided with a raw data set of K ordered symbols, to which it performs several steps. In a first step, 20, the encoder extracts from the raw data set a small subset of the symbols, henceforth referred to as the first data subset, whose cardinality shall be m. In a second step, 21, the first data subset is used to determine a starting state of the RSC encoder. In a third step, 22, the encoder determines the first position subset within a systematic set of K ordered symbols. In a fourth step, 23, the encoder fills the second position subset with the second data subset. In a fifth step, 24, the encoder determines a tail-biting set of m ordered symbols. In a sixth step, 25, the encoder fills the first position subset with the tail-biting set. In a seventh step, 26, the encoder encodes the systematic set of K ordered symbols using the first encoder. This process yields a tail-biting RSC codeword. This process is shown in part in FIG. 4 with respect to the m init1 bits (the first data subset, extracted in the first step), the K–m data bits (the second data subset), and the tail-biting set of m ordered symbols that form the complete input to the first encoder.

Figure 5:
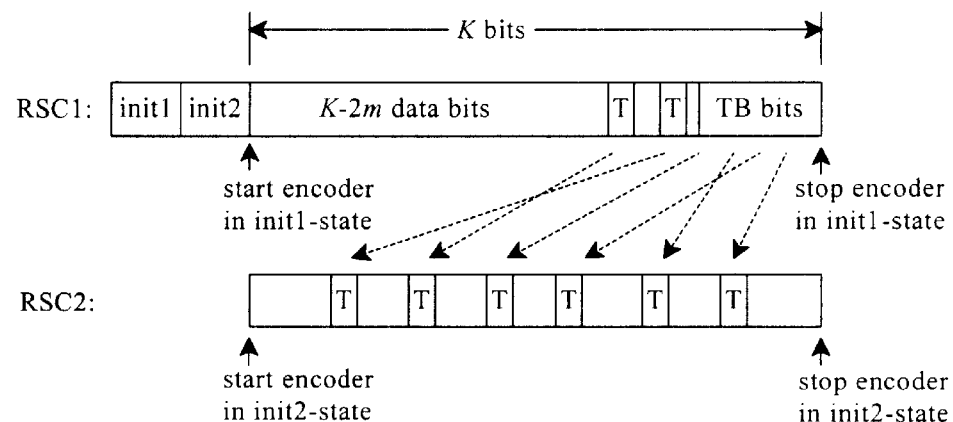
FIG. 5 illustrates two tail-biting RSC encoders in accordance with another embodiment of the invention.

The second main embodiment of Turbo-code encoding in accordance with this invention is shown in FIG. 5. This embodiment employs two tail-biting RSC codes. The tail-biting is implemented as follows. The first 2m data bits (or any other ordered subset of 2m data bits) are not sent or encoded, but are used to initialize the starting states for both RSC encoders. A preferred choice of a unique mapping approach is to simply use the first ordered subset of m data bits directly as the m-bit starting state (init1) for the first RSC encoder, and use the second ordered subset of m data bits directly as the m-bit starting state (init2) for the second RSC encoder.

Encoding now proceeds in a manner similar to that described for the dual termination approach. A set of 2m tail-biting (TB) positions, also referred to as the first position subset, (denoted by T in FIG. 5) and associated inverse matrix are precomputed as before. To start encoding, the remaining K–2m data bits are placed into the non-TB positions, also referred to as the second position subset, of the uninterleaved input block, and the 2m TB positions are filled with zeros. This K-bit block is interleaved and the two permutations are passed through the dual RSC encoder. Multiplying the difference between the total starting state and the total ending state by the inverse matrix gives the TB bits to be inserted into the TB positions. After inserting the TB bits into both permutations, the dual RSC encoder is run again to obtain the final encoded sequence. The result is that both RSC codes are tail-biting and the interleaver block size remains K.

As before, choosing the TB positions close to the end of the uninterleaved block, as shown in FIG. 5, reduces the additional encoder processing to about 50%. Again, this is negligible compared to the processing required by the associated Turbo decoder. Again, table lookup techniques can also be used to trade off memory for processing in the encoder.

Note that the 2m TB bits are included in the interleaver, but the initial 2m data bits are not. All encoded bits now receive equal protection (apart from interleaving effects). The advantage of this method over the dual termination method is that the code rate is not reduced. With an RSC code rate of ½ the overall unpunctured Turbo-code rate is exactly ⅓.

As for the previous tail-biting embodiment, this Turbo-code encoder is not strictly systematic because the initial 2m data bits are not represented directly by the systematic bits of the code, but are represented indirectly by the 2m TB bits, in order to attain flexibility in the encoding process. An assumption made above is that the rank of the mapping matrix, as described previously, is 2m. If the rank is less than 2m then the above procedure can be modified to work with fewer than 2m TB positions. This is typically of little concern, however, as the most powerful Turbo-codes (combinations of RSC encoder polynomials and interleavers) should satisfy this requirement. If the rank is less than 2m then a better RSC encoder feedback polynomial or interleaver should be selected. When decoding, the most likely starting state numbers for the two RSC codes determine the initial 2m data bits. Decoding is discussed in more detail below.

Figure 11:
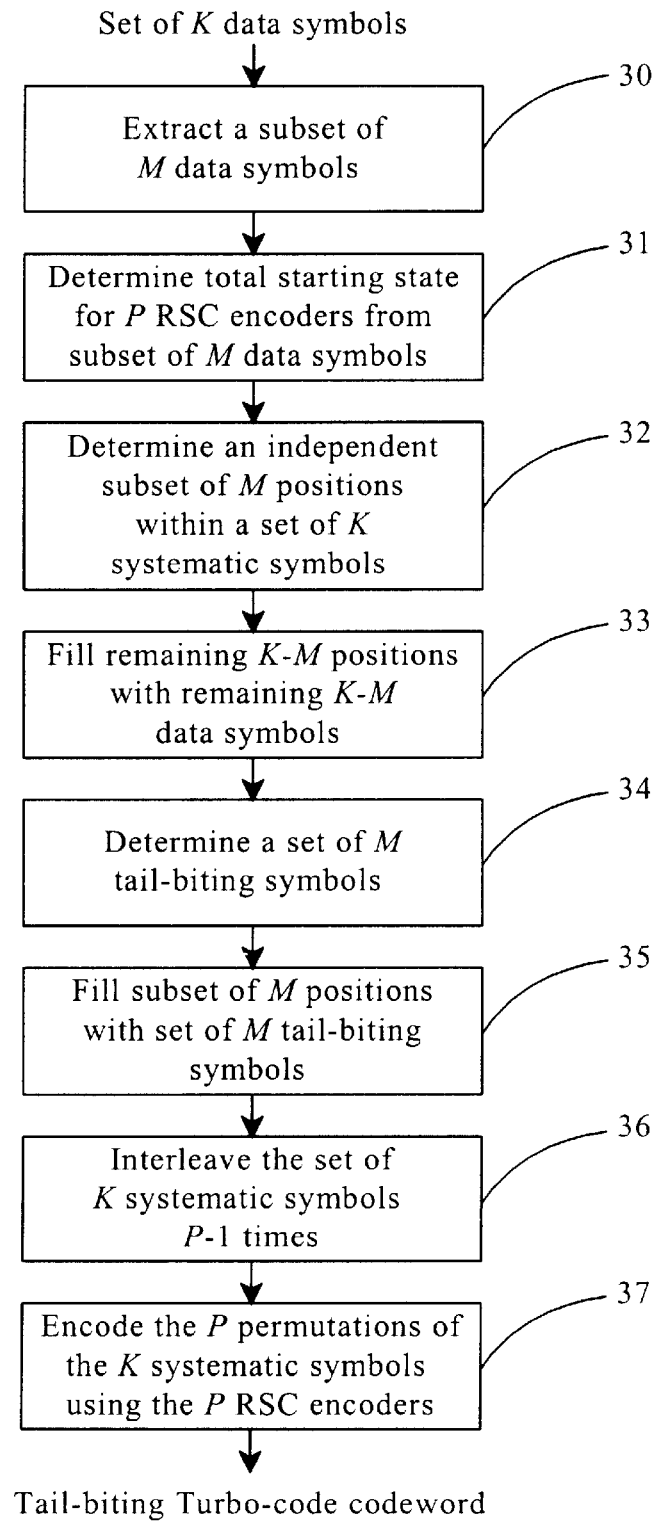
FIG. 11 illustrates yet another embodiment wherein the first K+m bits are used in the first encoder depicted in FIG. 4 and wherein the m init1 bits, the K–m data bits, and the tail-biting set of m ordered symbols form the complete input to the first encoder.

In accordance with this embodiment as shown in FIG. 11, the encoder is provided a raw data set of K ordered symbols, upon which it performs eight steps. In a first step, 30, the encoder extracts from the raw data set the first data subset, which has a cardinality of M. In a second step, 31, the encoder determines the total starting state for P different RSC encoders using the first data subset, extracted in the first step 30. In a third step, 32, the encoder determines the first position subset. In a fourth step, 33, the encoder fills the remaining second position subset with the second data subset which has a cardinality of K–M. In a fifth step, 34, the encoder determines the tail-biting set of M ordered symbols.

In a sixth step, 35, the encoder fills the first position subset with the tail-biting set of M ordered symbols, completing the systematic set. In a seventh step, 36, the encoder interleaves the systematic set of K ordered symbols (M symbols from the fifth step 34 and K−M symbols from the fourth step 33) P−1 times. In an eighth step, 37, the encoder encodes the P permutations of the systematic set using the P RSC encoders. This process yields a tail-biting Turbo-code codeword, as shown in FIG. 5.

It is also possible to mix the different approaches. As an exemplary mixed embodiment, the first RSC code is made to start and end in the zero state and the second RSC code is made to be tail-biting. The starting state for the second RSC code is then determined by the first m data bits (or any ordered subset of m data bits), and 2m bits are added to jointly terminate and tail-bite the first and second RSC codes, respectively. The final interleaver block size is K+m. This mixed approach is a compromise between dual termination and dual tail-biting, in terms of both code rate and decoding complexity. All the bits are well protected but m extra bits are required. Also, the more complicated tail-biting RSC decoder is required for only one of the two RSC codes.

Figure 6:
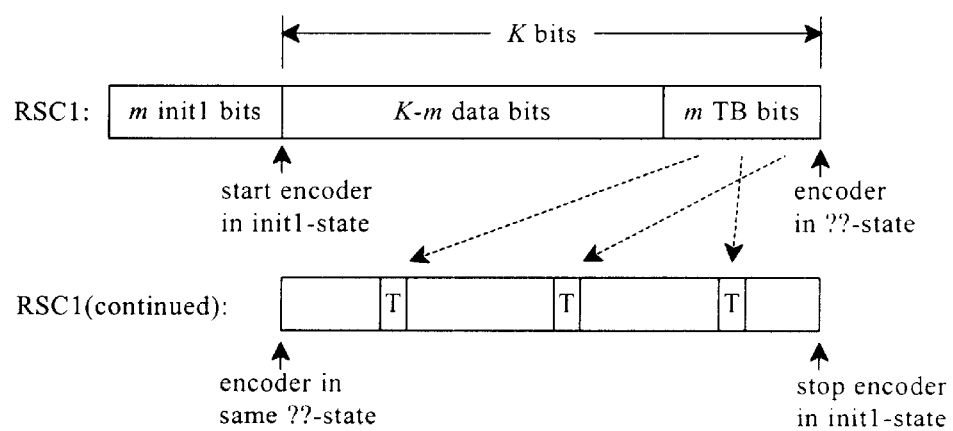
FIG. 6 illustrates a tail-biting single block Turbo-code encoder in accordance with yet another embodiment of the invention.
Figure 12:
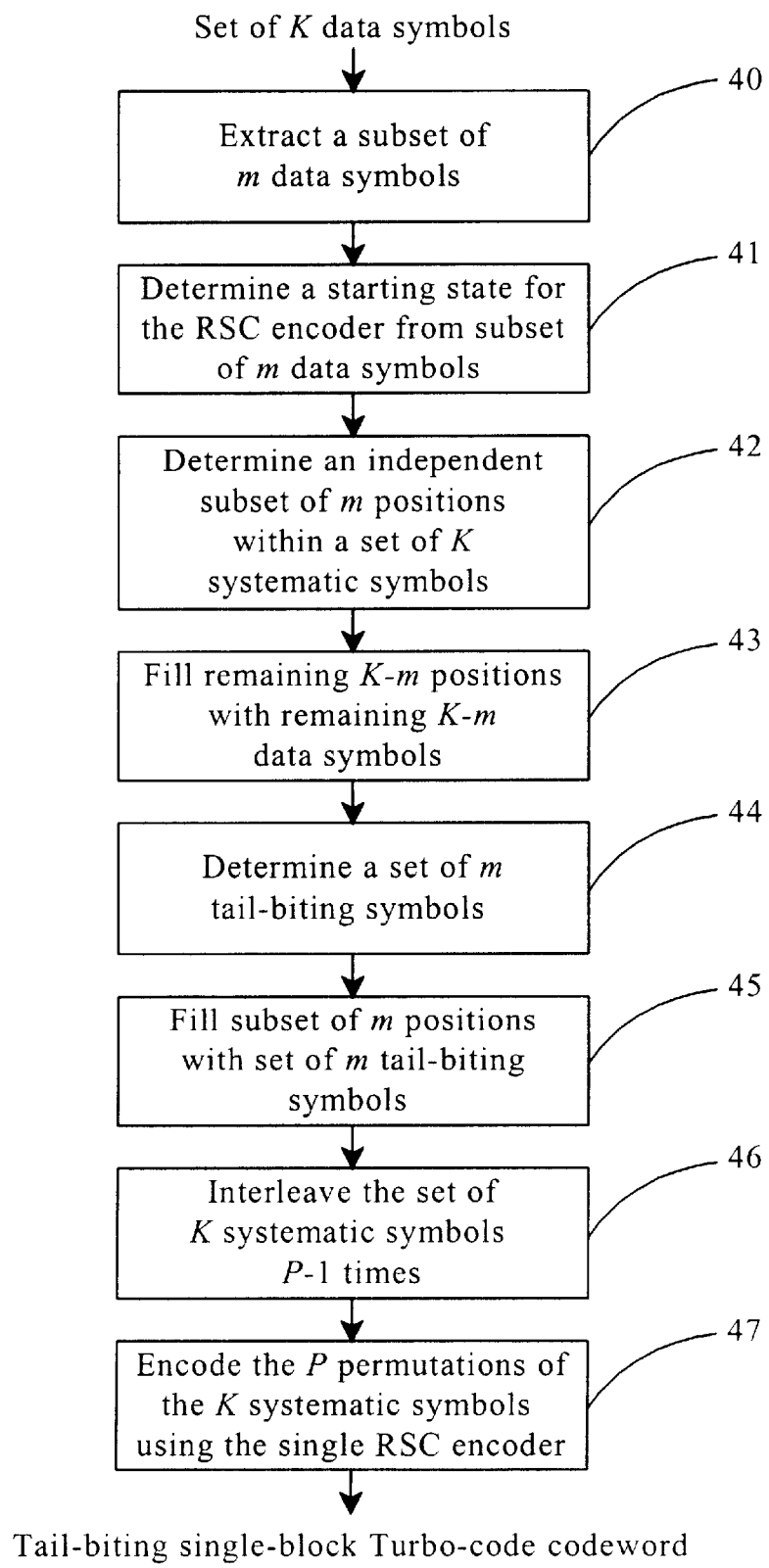
FIG. 12 illustrates the encoding steps associated with the embodiment of FIG. 6 wherein a tail-biting single-block Turbo-code is formed.

There are also several alternative tail-biting methods in accordance with this invention that are to be considered. For example, the uninterleaved and interleaved blocks could be encoded in a continuous stream using a single RSC encoder, as shown in FIG. 6. Here the first m data bits (or any ordered subset of m data bits) are used to determine the starting state, and m TB positions are required to force the ending state of the interleaved block to be the same as the starting state of the uninterleaved block. The result is one complete tail-biting RSC code with the systematic bits occurring twice within the code. As before, only one set of systematic bits is sent over the channel. The decoder is similar to that required for the dual tail-biting approach described earlier. Here some restrictions need to be placed on the interleaver in view that each systematic bit is included twice in a single RSC encoding. Each interleaver should be tested, as needed, to determine if the required m independent TB positions exist. The TB positions are not necessarily the last m positions of the uninterleaved block, as shown in FIG. 6, but they should be chosen close to the end to minimize encoder processing. FIG. 12 illustrates the steps required for this embodiment, where the encoder is provided a raw data set or K ordered symbols, upon which it performs eight steps. In a first step, 40, the encoder extracts from the raw data set the first data subset, which has a cardinality of m. In a second step, 41, the encoder determines the starting state for the first encoder using the first data subset. In a third step, 42, the encoder determines the first position subset within a systematic set of K ordered symbols. In a fourth step, 43, the encoder fills in the second position subset with the second data subset, the cardinality of which is K−m. In a fifth step, 44, the encoder determines a tail-biting set of m ordered symbols. In a sixth step, 45, the encoder fills the first position subset with the tail-biting set of m ordered symbols. In a seventh step, 46, the encoder interleaves the systematic set of K ordered symbols (m symbols from the fifth step 44 and K−m symbols from the fourth step 43 P−1 times. In an eighth step, 47, the encoder encodes the P permutations of the systematic set using the P RSC encoders. This process yields a tail-biting single-block Turbo-code codeword. This process is illustrated in FIG. 6 with respect to the assembly of a tail-biting single-block Turbo-code.

Figure 7:
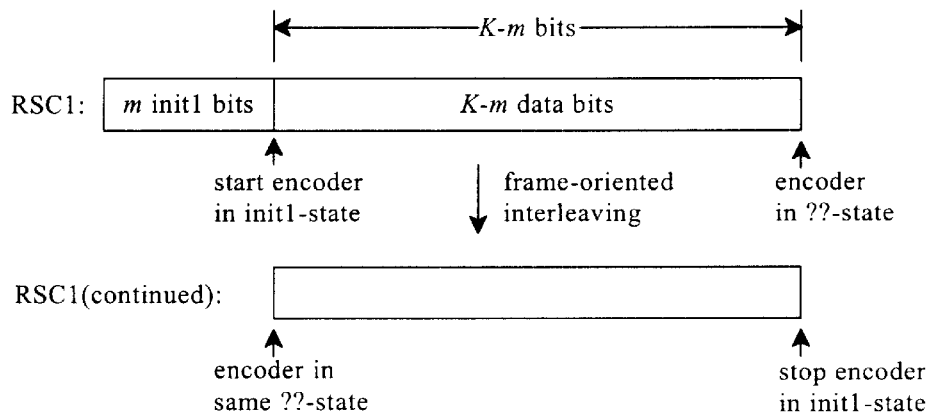
FIG. 7 illustrates a tail-biting frame-oriented Turbo-code encoder in accordance with yet another embodiment of the invention.
Figure 8:
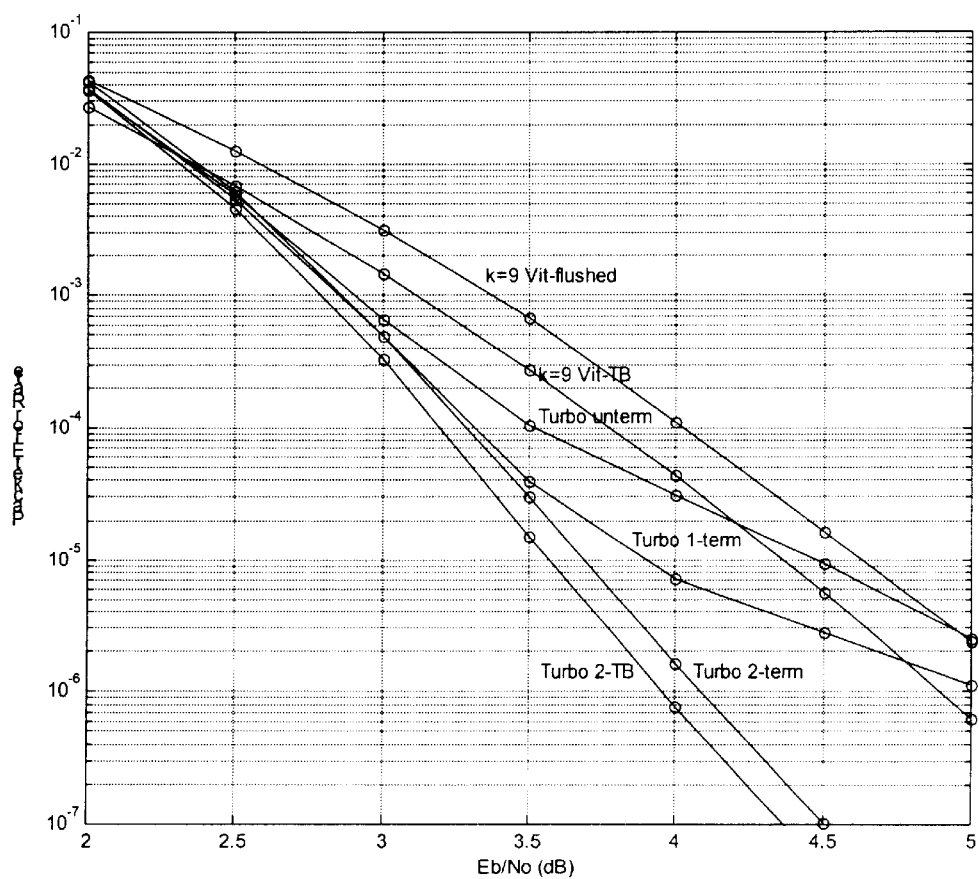
FIG. 8 illustrates in a graph the Performance statistics of the dual tail-biting encoding scheme (Turbo 2-TB) versus a dual terminated encoding scheme (Turbo 2-term), a singly terminated encoding scheme (Turbo 1-term), an unterminated encoding scheme (Turbo unterm), a tail-biting Viterbi encoding scheme (Vit-TB) and a flushed Viterbi encoding scheme (Vit-flushed)
Figure 13:
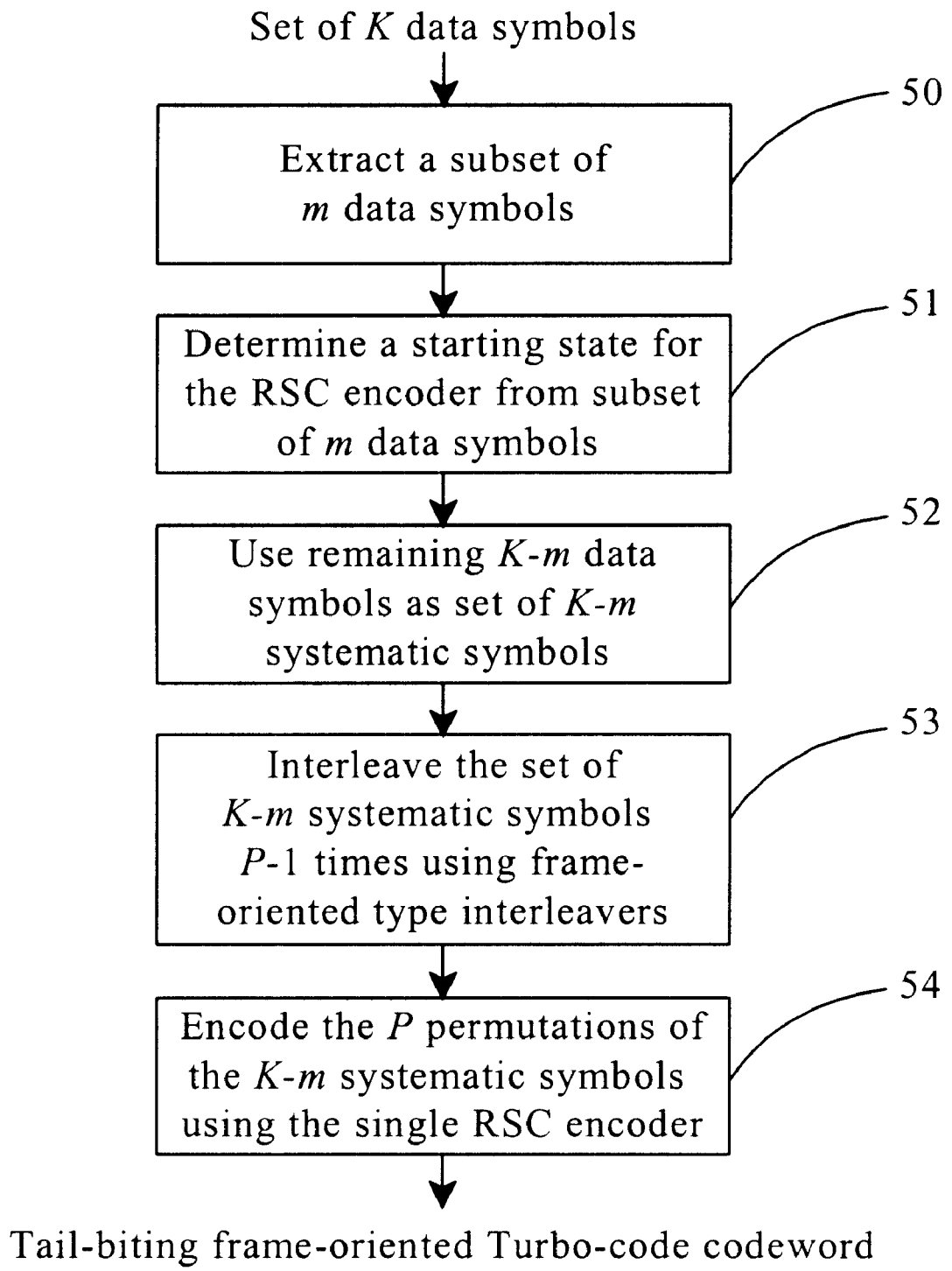
FIG. 13 illustrates the encoding steps associated with the embodiment of FIG. 7 wherein a tail-biting frame-oriented single-block Turbo-code is formed.

In other alternative embodiments of this invention, the frame-oriented Turbo-code of Berrou and Jezequel is modified to include tail-biting, as is shown in FIG. 7. The first m data bits (or any ordered subset of m data bits) are used to determine the starting state. The K−m remaining data bits must be a multiple of p, and the interleaver must have the same properties as the frame-oriented interleaver described above. The ending state will be the same as the starting state because of the repetition period, p, the constraints placed on the block length and the interleaver, and the linearity properties of the code. The result is a tail-biting frame-oriented Turbo-code. This embodiment is illustrated in FIG. 13 where the encoder starts with a raw data set of K ordered symbols. The first step, 50, extracts from the raw data set the first data subset which will be of cardinality m. In a second step, 51, the encoder determines a starting state for the first encoder using the first data subset. In a third step, 52, the encoder uses the second data subset as a systematic set of K−m symbols. In a fourth step, 53, the encoder interleaves the systematic set P−1 times using frame-oriented type interleavers. In a fifth step, 54, the encoder encodes the P permutations of the systematic set using the first encoder. This process yields a tail-biting frame-oriented Turbo-code codeword.

In yet other alternative embodiments, the above methods are extended to more than two RSC codes, to obtain more powerful low-rate codes. In this context the dual tail-biting (TB) method, shown in FIG. 5, is considered first. Then the single-block TB method, shown in FIG. 6, is considered. The TB frame-oriented approach shown in FIG. 7 is also extended.

The method of using 2 TB RSC codes is easily generalized to P TB RSC codes, operating on P different permutations of the K systematic bits, with P−1 interleavers, in accordance with this invention as described in the following. The first Pm data bits (or any ordered subset of Pm data bits) are not sent or encoded. Rather, these Pm data bits are simply used to determine the starting states for all P RSC encoders. A preferred choice for unique mapping is to use the P sets of m bits directly to initialize the P m-bit starting states. Encoding now proceeds in a manner similar to that described for the dual TB approach. The Pm independent TB positions are determined and the associated inverse matrix is precomputed. To start encoding, the remaining K−Pm data bits are placed in the non-TB positions of the first input block, and the Pm TB positions are filled with zeros. This K-bit block is interleaved P−1 times and passed through the P RSC encoders. Multiplying the difference between the total starting state and the total ending state by the inverse matrix gives the TB bits to be inserted in the TB positions. After inserting the TB bits into all P permutations, the P RSC encoders are run again to obtain the final encoded sequence. The result is that all P RSC codes are tail-biting and the interleaver block size remains K. With an RSC code rate of ½, the overall unpunctured Turbo-code rate is 1/(P+1).

The method of using one complete TB RSC code and one interleaver, as illustrated in FIG. 6, is also easily generalized to P permutations using P−1 interleavers, in accordance with this invention. As before, the first m data bits (or any ordered subset of m data bits) are used to determine the starting state, and m TB positions are required to force the ending state for the last permutation into the same state as the starting state.

The result is one complete TB RSC code with the systematic bits occurring P times within the code. As before, only one set of systematic bits is sent over the channel. Again, there may be restrictions on the interleaver because each systematic bit is included P times in a single RSC encoding, but these restrictions need not be formally specified. This is because each set of P−1 interleavers would naturally be tested, as needed, to determine if the required m independent TB positions exist.

The previously described frame-oriented and new tail-biting frame-oriented Turbo-code methods can also be generalized in accordance with this invention to use more than one interleaver. The first set of K−m symbols is interleaved P−1 times to form the P permutations of the K−m symbols. These P permutations are restricted to be of a frame-oriented type. That is, each symbol in each permutation is paired with the same symbol in a different permutation that is an integer multiple of p systematic elements away. As before, K−m must still be a multiple of p.

To decode that tail-biting RSC code the following embodiment is described in accordance with this invention: APP decoding involves four sets of calculations. Assuming a log-domain implementation, there are the forward metrics, the backward metrics, the combined metrics, and the output log-likelihood ratios (LLR's). The forward metrics require information about the starting state, but do not require information about the ending state. In the conventional log-APP decoder the starting state is usually known to be zero, and the starting forward metrics are initialized accordingly. With tail-biting the forward metrics are initialized by starting the forward metric calculations back in time (in a modulo sense, due to tail-biting) several constraint lengths. It has been determined experimentally that 5 to 10 constraint lengths, depending on the puncture rate of the code, is usually sufficient to obtain most of the benefit. Only the forward metrics are computed in this overlap region. The amount of overlap is denoted as V. The recommended initialization is to weight all states equally prior to starting the forward metric calculations. No additional forward metric calculations are required at the end of the block or permutation.

Similarly, with tail-biting, the backward metrics are initialized by starting the backward metric calculations forward in time (in a modulo sense) by several constraint lengths. Again, 5 to 10 constraint lengths are usually sufficient and only the backward metrics are computed in this overlap region. A preferred initialization is to weight all states equally prior to starting the backward metric calculations. No additional backward metric calculations are required at the start of the permutation.

The combined metrics and LLRs are computed as usual according to prior art methods, using the resulting forward and backward metrics. No additional overlap processing is required for these two calculations. Thus, the complexity is not increased for this portion of the processing. Depending on the implementation, the forward and backward metric calculations together usually represent between ½ and ⅔ of the total processing required per data bit. Thus, the additional processing required with tail-biting, per APP decoder, is a simple function of the block size and the amount of overlap V.

Another requirement for tail-biting concerns the way the initial non-systematic data bits, used to define the starting and/or ending states for the RSC encoders, are decoded. These data bits cannot be determined directly from the LLRs, but must be determined from their corresponding decoded state values. When the data corresponds to a state that is part of the final APP decoding (last half-iteration), then this data is simply determined by the most likely state number at the appropriate location within the permutation. The extra processing required is negligible since most of the work has already been performed by computing the LLR's, and only one state number is required. If the data of interest is associated with a state from the other APP decoder then there are two options. The first option is to extract this data from the previous APP decoding (previous half-iteration). The reliability of these few data bits is slightly degraded, due to being extracted from the previous half-iteration, but there is essentially no extra work involved. The second option is to extract this data from the next (partial) half-iteration. In this case, the bits associated with the state of interest receive half an iteration of extra protection. The amount of extra processing is again small because only the forward and backward metrics (one overlap length of V each) on either side of the state of interest need to be calculated.

The amount of extra processing is essentially the same as the overhead processing associated with tail-biting on each previous APP decoding. Given 4 or more iterations (8 or more APP decoding operations or half-iterations), this extra processing becomes negligible in comparison to the tail-biting overhead processing already incurred. In either case, the amount of extra processing is very small. In conclusion, the processing overhead with tail-biting Turbo decoding is quite small for practical block sizes of interest (between 100 and 1000 bits).

Of course, numerous variations and adaptations may be made to the particular embodiments of the invention described above, without departing from the spirit and scope of the invention, which is defined in the claims.

What is claimed is:

1. A method of encoding a set of K data symbols as a set of K systematic symbols and a set of K parity symbols using a recursive systematic convolutional encoder having the set of K systematic symbols as its input and having a memory size of m symbols, where m is at least one, the method comprising:

dividing the set of data symbols into first and second distinct data subsets, having m and K−m data symbols in each set respectively;

determining a starting state for the encoder that has a one-to-one correspondence with the m symbols in the first data subset;

dividing the systematic set into distinct first and second systematic subsets, the first systematic subset having m ordered symbols, and the second systematic subset having K−m symbols, where the K−m symbols of the second systematic subset have a one-to-one correspondence with the K−m symbols of the second data subset, and the m symbols in the first systematic subset, and their positions within the systematic set, are selected based on the determined starting state of the encoder, the K−m symbols of the second systematic subset and the position of the K−m symbols of the second systematic subset in the systematic set to create a tail-biting systematic set; and generating the set of parity symbols corresponding to the systematic set and the starting state for the encoder.

2. The method of claim 1, wherein the step of determining a starting state for the encoder further includes determining a starting state that is a permutation of the m symbols of the first data subset.

3. The method of claim 1, wherein the m symbols of the first data subset are selected based on the positions of the m symbols of the first systematic subset within the systematic set.

4. The method of claim 1, further including:

generating a permutation of the systematic set, henceforth referred to as the second permutation of the systematic set, where the order of the second permutation is distinct from the order of the systematic set; and generating a second set of parity symbols corresponding to the second permutation and the starting state of a second systematic convolutional encoder.

5. A method of decoding a set of samples representing a set of data symbols encoded according to the encoding method of claim 1, to obtain a set of decoded data symbols, the decoding method comprising:

receiving the set of samples;

deriving an estimate of the symbols of the second data subset on the basis of the received set of samples using a method of data estimation;

deriving an estimate of the starting state of the encoder on the basis of the received set of samples using a method of state estimation;

mapping said estimate of the starting state of the encoder to an estimate of the symbols of the first data subset; and deriving the set of decoded data symbols from the estimates of the symbols in the first and second data subsets.

6. The method of claim 5, wherein the method of data estimation is based on maximum likelihood sequence estimation with overlapped processing.

7. The method of claim 5, wherein the method of data estimation is based on maximum a posteriori probability data estimation with overlapped processing.

8. The method of claim 5, wherein the method of state estimation is based on maximum likelihood state estimation with overlapped processing.

9. A method of encoding a set of K data symbols as a set of K systematic symbols and a plurality of sets of parity symbols using a plurality of recursive systematic convolutional encoders, each encoder having a memory size of at least 1 symbol, the sum of the memory sizes of the plurality of encoders being M, and a plurality of interleavers, numbering no fewer than one less than the number of encoders, the method comprising:

dividing the set of data symbols into first and second distinct data subsets, having M and K−M data symbols in each set respectively;

determining a total starting state for the plurality of encoders that has a one-to-one correspondence with the M symbols in the first data subset and corresponds to a representation of the starting states of each of the plurality of encoders;

dividing the systematic set into distinct first and second systematic subsets, the first systematic subset having M ordered symbols, and a second systematic subset having K−M symbols, where the K−M symbols of the second systematic subset having a one-to-one correspondence with the K−M symbols of the second data subset, and the M symbols in the first systematic subset, and their positions within the systematic set, are selected based on the determined total starting state of the encoder, the K−M symbols of the second systematic subset and the position of the K−M symbols of the second systematic subset in the systematic set to create a tail-biting systematic set for the plurality of encoders such that the encoders upon encoding the K symbols of the systematic set each have an ending state identical to their starting state;

interleaving the systematic set, using the plurality of interleavers to produce a unique permutation of the systematic set corresponding to each interleaver; and generating the plurality of sets of parity symbols, the parity sets corresponding to the starting state of each encoder and the systematic set, or permutation of the systematic set associated with each encoder.

10. The method of claim 9, wherein the step of determining a total starting state for the encoder further includes determining a starting state that is a permutation of the M symbols in the first data subset.

11. The method of claim 9, wherein the M symbols of the first data subset are selected based on the positions of the M symbols of the first systematic subset within the systematic set.

12. A method of decoding a set of samples representing a set of data symbols encoded according to the encoding method of claim 9, to obtain a set of decoded data symbols, the decoding method comprising:

receiving the set of samples;

deriving an estimate of the symbols of the second data subset on the basis of the received set of samples using a method of iterative data estimation;

deriving an estimate of the total starting state of the plurality of encoders, consisting of estimates of all individual starting states of the plurality of encoders, where each individual starting state estimate is derived on the basis of the received set of samples using a method of state estimation; and mapping said estimate of the total starting state of the plurality of encoders to an estimate of the symbols of the first data subset;

deriving the set of decoded data symbols from the estimates of the symbols in the first and second data subsets.

13. The method of claim 12, wherein the method of iterative data estimation is based on iterative a posteriori probability data estimation with overlapped processing.

14. The method of claim 12, wherein the method of state estimation is based on maximum likelihood state estimation with overlapped processing.

15. A method of encoding a set of K data symbols as a set of K systematic symbols and a set of parity symbols using a recursive systematic convolutional encoder having a memory size of m symbols, where m is at least 1, and a plurality of interleavers, having as their input the systematic set of K symbols, said method comprising:

dividing the set of data symbols into first and second distinct data subsets, having m and K−m data symbols in each set respectively;

determining a starting state for the encoder that has a one-to-one correspondence with the m symbols in the first data subset;

dividing the systematic set into distinct first and second systematic subsets, the first systematic subset having m ordered symbols, and the second systematic subset having K−m symbols, where the K−m symbols of the second systematic subset have a one-to-one correspondence with the K−m symbols of the second data subset, and the m symbols in the first systematic subset, and their positions within the systematic set, are selected based on the determined starting state of the encoder, the K−m symbols of the second systematic subset and the position of the K−m symbols of the second systematic subset in the systematic set to create a tail-biting systematic set based on the starting state of the encoder, the plurality of interleavers, and the K−m symbols in the second systematic subset;

interleaving the systematic set in each of the plurality of interleavers to get unique permutations of the systematic set corresponding to each interleaver; and generating the set of parity symbols from the starting state of the encoder, and a contiguous block of symbols corresponding to the systematic set and the permutations of the systematic set that corresponds to each interleaver.

16. The method of claim 15, wherein the step of determining a starting state for the encoder further includes determining a starting state that is a permutation of the m symbols in the first data subset.

17. The method of claim 15, wherein the m symbols of the first data subset are selected based on the positions of the symbols of the first systematic subset within in the systematic set.

18. A method of decoding a set of samples representing a set of data symbols encoded according to the encoding method of claim 15, to obtain a set of decoded data symbols, the decoding method comprising:

receiving the set of samples;

deriving an estimate of the symbols of the second data subset on the basis of the received set of samples using a method of iterative data estimation;

deriving an estimate of the starting state of the encoder on the basis of the received set of samples using a method of state estimation;

mapping said estimate of the starting state of the encoder to an estimate of the symbols of the first data subset; and deriving the set of decoded data symbols from the estimates of the symbols in the first and second data subsets.

19. The method of claim 18, wherein the method of iterative data estimation is based on iterative a posteriori probability data estimation with overlapped processing.

20. The method of claim 18, wherein the method of state estimation is based on maximum likelihood state estimation with overlapped processing.

21. A method of encoding a set of K data symbols as a set of K−m systematic symbols and a set of parity symbols using a recursive systematic convolutional encoder having a repetition period and a memory size of m symbols, where m is at least 1, and a plurality of interleavers, having as their input the systematic set of K−m symbols, said method comprising:

dividing the set of data symbols into first and second distinct data subsets, having m and K−m symbols in each subset respectively, where K−m is an integer multiple of the repetition period, and the second data subset is the complete set of K−m systematic symbols;

determining a starting state for the encoder that has a one-to-one correspondence with the m symbols in the first data subset;

interleaving the systematic set in each of the plurality of interleavers to get unique permutations of the systematic set corresponding to each interleaver; and generating the set of parity symbols from the determined starting state of the encoder and a contiguous block of symbols representing an even number of permutations of the complete set of K−m systematic symbols, where each symbol in each permutation is an integer multiple of the repetition period symbols away from the same symbol in another permutation in the contiguous block, to create a tail-biting contiguous block.

22. The method of claim 21, wherein the step of determining a starting state for the encoder further includes determining a starting state that is a permutation of the m symbols in the first data subset.

23. A method of decoding a set of samples representing a set of data symbols encoded according to the encoding method of claim 21, to obtain a set of decoded data symbols, the decoding method comprising:

receiving the set of samples;

deriving an estimate of the symbols of the second data subset on the basis of the received set of samples using a method of iterative data estimation;

deriving an estimate of the starting state of the encoder on the basis of the received set of samples using a method of state estimation;

mapping said estimate of the starting state of the encoder to an estimate of the symbols of the first data subset; and deriving the set of decoded data symbols from the estimates of the symbols in the first and second data subsets.

24. The method of claim 23, wherein the method of iterative data estimation is based on iterative a posteriori probability data estimation with overlapped processing.

25. The method of claim 23, wherein the method of state estimation is based on maximum likelihood state estimation with overlapped processing.

26. An encoder, for encoding K data symbols as a set of K systematic symbols and a set of K parity symbols, having a recursive systematic convolutional encoder, the recursive systematic convolutional encoder having a memory of m symbols and having as its input the systematic set, for generating the set of parity symbols based on a starting state and the systematic set, the encoder comprising:

buffer means for storing the set of K data symbols;

data set dividing means operatively attached to the buffer means to receive the set of K data symbols, for dividing the set of K data symbols stored in the buffer means into a first data subset of m symbols and a second data subset of K−m symbols;

reset means operatively attached to the data set dividing means and the recursive systematic convolutional encoder, for initializing the recursive systematic convolutional encoder with a starting state that corresponds to the m symbols of the first data subset; and systematic set generating means, operatively attached to the data set dividing means and the recursive systematic convolutional encoder, for generating the systematic set from the K−m symbols of the second data subset, and a set of m tail-biting symbols chosen based on the starting state of the recursive systematic convolutional encoder, the K−m symbols of the second data subset and the position of the K−m symbols in the systematic set and for providing the generated systematic set to the recursive systematic convolutional encoder.

27. A decoder for decoding a set of samples representing a set of data symbols encoded by the encoder of claim 26, to a decoded set of data symbols, the decoder comprising:

a memory for storing the set of samples;

a data estimator, operatively attached to the memory for receiving the set of samples, the data estimator for estimating the second data subset from the set of samples;

a starting state estimator, operatively attached to the memory for receiving the set of samples, the starting state estimator for estimating the starting state of the encoder from the set of samples, and for mapping the estimate of the starting state to an estimate of the first data subset; and a decoded set estimator operatively attached to the data estimator for receiving the estimated second data subset, and to the starting state estimator for receiving the estimated first data subset, for deriving the decoded set of data symbols from the estimated first and second data subsets.

28. An encoder, for encoding K data symbols as a set of K systematic symbols and a plurality of sets of parity symbols, having a plurality of interleavers for generating a plurality of sets of interleaved symbols, a plurality of recursive systematic convolutional encoders, each recursive systematic convolutional encoder having a memory of at least one symbol, the sum of the memories of the plurality of recursive systematic convolutional encoders being M symbols, each recursive systematic convolutional encoder having as its input one of the plurality of sets of interleaved symbols, for generating the set of parity symbols based on a starting state for each recursive systematic convolutional encoder and the plurality of sets of interleaved symbols, the encoder comprising:

buffer means for storing the set of K data symbols;

data set dividing means operatively attached to the buffer means to receive the set of K data symbols, for dividing the set of K data symbols stored in the buffer means into a first data subset of M symbols and a second data subset of K–M symbols;

reset means operatively attached to the data set dividing means and the plurality of recursive systematic convolutional encoders, for initializing each of the plurality of recursive systematic convolutional encoders with a starting state, such that a total starting state, corresponding to starting states of each of the plurality of recursive systematic convolutional encoders, corresponds to the M symbols of the first data subset; and systematic set generating means, operatively attached to the data set dividing means and the plurality of interleavers, for generating the systematic set from the K–M symbols of the second data subset, and a set of M tail-biting symbols chosen based on the total starting state of the plurality of recursive systematic convolutional encoders which corresponds to the M symbols of the first data subset, the K–M symbols of the second data subset and the position of the K–M symbols in the systematic set, and the plurality of interleavers, and for providing the generated systematic set to the plurality of interleavers.

29. A decoder for decoding a set of samples representing a set of data symbols encoded by the encoder of claim 28, to a decoded set of data symbols, the decoder comprising:

a memory for storing the set of samples;

an iterative data estimator, operatively attached to the memory for receiving the set of samples, the iterative data estimator for iteratively estimating the second data subset from the set of samples;

a starting state estimator, operatively attached to the memory for receiving the set of samples, the starting state estimator for estimating the total starting state, consisting of estimates of the starting states of each of the recursive systematic convolutional encoders, from the set of samples and for mapping the estimate of the total starting state to an estimate of the first data subset; and a decoded set estimator operatively attached to the iterative data estimator for receiving the estimated second data subset, and the starting state estimator for receiving the estimated first data subset, for deriving the decoded set of data symbols from the estimated first and second data subsets.

30. An encoder, for encoding K data symbols as a set of K systematic symbols and a set of parity symbols, having a plurality of interleavers for generating a plurality of sets of interleaved symbols, a recursive systematic convolutional encoder, having a memory of at least m symbols and having as its input the plurality of sets of interleaved symbols, for generating the sets of parity symbols based on a starting state of the recursive systematic convolutional encoder and the plurality of sets of interleaved symbols, the encoder comprising:

buffer means for storing the set of K data symbols;

data set dividing means operatively attached to the buffer means to receive the set of K data symbols, for dividing the set of K data symbols stored in the buffer means into a first data subset of m symbols and a second data subset of K–m symbols;

reset means operatively attached to the data set dividing means and the recursive systematic convolutional encoder, for initializing the recursive systematic convolutional encoder with a starting state that corresponds to the m symbols of the first data subset; and systematic set generating means, operatively attached to the data set dividing means and the plurality of interleavers, for generating the systematic set from the K–m symbols of the second data subset, and a set of m tail-biting symbols chosen based on the starting state of the recursive systematic convolutional encoder, the K–m symbols of the second data subset and the position of the K–m symbols in the systematic set, and the plurality of interleavers, and for providing the generated systematic set to the plurality of interleavers.

31. A decoder for decoding a set of samples representing a set of data symbols encoded by the encoder of claim 30, to a decoded set of data symbols, the decoder comprising:

a memory for storing the set of samples;

an iterative data estimator, operatively attached to the memory for receiving the set of samples, the iterative data estimator for iteratively estimating the second data subset from the set of samples;

a starting state estimator, operatively attached to the memory for receiving the set of samples, the starting state estimator for estimating the starting state of the encoder, from the set of samples, and for mapping the estimate of the total starting state to an estimate of the first data subset; and a decoded set estimator operatively attached to the iterative data estimator for receiving the estimated second data subset, and the starting state estimator for receiving the estimated first data subset, for deriving the decoded set of data symbols from the estimated first and second data subsets.

32. An encoder, for encoding K data symbols as a set of K–m systematic symbols and a set of parity symbols, having a plurality of interleavers for generating a plurality of sets of interleaved symbols, a recursive systematic convolutional encoder, having a memory of m symbols, a repetition period, and having as its input the plurality of sets of interleaved symbols, for generating the sets of parity symbols based on a starting state of the recursive systematic convolutional encoder and the plurality of sets of interleaved symbols, the encoder comprising:

buffer means for storing the set of K data symbols;

data set dividing means operatively attached to the buffer means to receive the set of K data symbols, for dividing the set of K data symbols stored in the buffer means into a first data subset of m symbols and a second data subset of K−m symbols;

reset means operatively attached to the data set dividing means and the recursive systematic convolutional encoder, for initializing the recursive systematic convolutional encoder with a starting state that corresponds to the m symbols of the first data subset; and systematic set generating means, operatively attached to the data set dividing means and the plurality of interleavers, for generating the systematic set from the K−m symbols of the second data subset, and for providing the generated systematic set to the plurality of interleavers.

33. A decoder for decoding a set of samples representing a set of data symbols encoded by the encoder of claim 32, to a decoded set of data symbols, the decoder comprising:

a memory for storing the set of samples;

an iterative data estimator, operatively attached to the memory for receiving the set of samples, the iterative data estimator for iteratively estimating the second data subset from the set of samples;

a starting state estimator, operatively attached to the memory for receiving the set of samples, the starting state estimator for estimating the starting state of the encoder, from the set of samples and for mapping the estimate of the starting state to an estimate of the first data subset; and a decoded set estimator operatively attached to the iterative data estimator for receiving the estimated second data subset, and the starting state estimator for receiving the estimated first data subset, for deriving the decoded set of data symbols from the estimated first and second data subsets.

* * * * *

UNITED STATES PATENT AND TRADEMARK OFFICE
CERTIFICATE OF CORRECTION

PATENT NO.   : 6,530,059 B1
DATED        : March 4, 2003
INVENTOR(S)  : Crozier et al.

It is certified that error appears in the above-identified patent and that said Letters Patent is hereby corrected as shown below:

<u>Title page,</u>
Item [75], delete "Kanats" and insert therefor -- Kanata --.
Item [56], OTHER PUBLICATIONS, 4th reference, delete "SOVIA" and insert therefor -- SOVA --.

<u>Column 3,</u>
Line 4, delete "tail-citing" and insert therefor -- tail biting --.
Line 28, delete "codes of" and insert therefor -- codes or --.

<u>Column 4,</u>
Line 14, delete "b" and insert therefor -- by --.

<u>Column 14,</u>
Lines 15-19, delete "yet another embodiment wherein the first K+m bits are used in the first encoder depicted in FIG. 4 and wherein the m init1 bits, the K-m data bits, and the tail-biting set of m ordered symbols form the complete input to the first encoder;" and insert therfor: -- FIG. 11 illustrates the encoding steps associated with the embodiment of Fig. 5, wherein a tail-biting Turbo-code codeword is formed. --
Line 67, delete "bit in" and insert therefor -- bit is --.

Signed and Sealed this

Twenty-eighth Day of October, 2003

JAMES E. ROGAN
*Director of the United States Patent and Trademark Office*